US008405560B2

(12) United States Patent
Sakata et al.

(10) Patent No.: US 8,405,560 B2
(45) Date of Patent: Mar. 26, 2013

(54) ANTENNA EVALUATION APPARATUS AND ANTENNA EVALUATION METHOD FOR CREATING DIFFERENT SETS OF MULTIPATH WAVES AROUND RECEIVING ANTENNA

(75) Inventors: Tsutomu Sakata, Osaka (JP); Atsushi Yamamoto, Kyoto (JP); Satoru Amari, Osaka (JP)

(73) Assignee: Panasonic Corporation, Osaka (JP)

( * ) Notice: Subject to any disclaimer, the term of this patent is extended or adjusted under 35 U.S.C. 154(b) by 240 days.

(21) Appl. No.: 13/003,814

(22) PCT Filed: Apr. 28, 2010

(86) PCT No.: PCT/JP2010/003048
§ 371 (c)(1),
(2), (4) Date: Jan. 12, 2011

(87) PCT Pub. No.: WO2010/137237
PCT Pub. Date: Dec. 2, 2010

(65) Prior Publication Data
US 2011/0122032 A1  May 26, 2011

(30) Foreign Application Priority Data

May 29, 2009 (JP) ................. 2009-130398

(51) Int. Cl.
*H01Q 3/00* (2006.01)
(52) U.S. Cl. ......... 343/703; 343/757; 343/853; 342/360
(58) Field of Classification Search ............... 343/703, 343/757, 853; 342/360, 372
See application file for complete search history.

(56) References Cited

U.S. PATENT DOCUMENTS

| 4,864,315 | A | * | 9/1989 | Mohuchy | 343/703 |
| 5,214,435 | A | * | 5/1993 | Lopez | 342/360 |
| 5,270,723 | A | * | 12/1993 | Lopez et al. | 343/703 |
| 5,365,241 | A | * | 11/1994 | Williams et al. | 343/703 |
| 5,374,934 | A | * | 12/1994 | Miura et al. | 342/360 |

(Continued)

FOREIGN PATENT DOCUMENTS

| JP | 2005-227213 | 8/2005 |
| JP | 2005-303472 | 10/2005 |

(Continued)

OTHER PUBLICATIONS

International Preliminary Report on Patentability issued Dec. 22, 2011 in International (PCT) Application No. PCT/JP2010/003048.

(Continued)

*Primary Examiner* — Tho G Phan
(74) *Attorney, Agent, or Firm* — Wenderoth, Lind & Ponack, L.L.P.

(57) ABSTRACT

An antenna evaluation apparatus includes receiving antennas to be evaluated, scatterer antennas surrounding the receiving antennas, a signal generator, a divider, a phase-shift circuit, and a computer. The computer generates first and second initial phase vectors each corresponding to a different set of multipath waves, determines a third initial phase vector including arbitrary initial phases each between a pair of corresponding initial phases in the first and second initial phase vectors, adjusts the phases of the radio frequency signals using the phase-shift circuit such that the phases of the radio frequency signals have corresponding initial phases in the third initial phase vector, and makes the adjusted radio frequency signals radiate.

26 Claims, 11 Drawing Sheets

U.S. PATENT DOCUMENTS

| | | | | |
|---|---|---|---|---|
| 6,469,672 | B1 * | 10/2002 | Marti-Canales et al. | 343/703 |
| 6,943,745 | B2 * | 9/2005 | Rao et al. | 343/757 |
| 7,855,696 | B2 * | 12/2010 | Gummalla et al. | 343/876 |

FOREIGN PATENT DOCUMENTS

| | | |
|---|---|---|
| JP | 2007-67951 | 3/2007 |
| JP | 2008-263406 | 10/2008 |
| JP | 2009-49966 | 3/2009 |

OTHER PUBLICATIONS

International Search Report issued Jun. 29, 2010 in International (PCT) Application No. PCT/JP2010/003048.

Tsutomu Sakata et al., "Evaluation of Mobile Terminal Antennas using Spatial Fading Emulator", Matsushita Technical Journal, vol. 52, No. 5, pp. 70-75, Oct. 2006 (along with English Abstract).

Tsutomu Sakata et al., "Channel Capacity Measurements of a MIMO Antenna under a Rayleigh-fading Channel by a Spatial Fading Emulator", Proceedings of the 2007 IEICE Society Conference, B-1-9, Sep. 2007 (along with partial English translation).

Tsutomu Sakata et al., "A Multipath Measurement System with a Variable Power Angular Spectrum for Handset MIMO Antennas", IEICE Technical Report, vol. 108, No. 5, pp. 13-18, Apr. 2008 (along with English Abstract).

Tsutomu Sakata et al., "An Evaluation of the MIMO Transmission Characteristics in a Cluster Propagation Environment Using a Spatial Fading Emulator", IEICE Technical Report, vol. 108, No. 429, pp. 121-126, Apr. 2009 (along with English Abstract).

* cited by examiner

ANTENNA EVALUATION APPARATUS AND ANTENNA EVALUATION METHOD FOR CREATING DIFFERENT SETS OF MULTIPATH WAVES AROUND RECEIVING ANTENNA

TECHNICAL FIELD

The present invention relates to an antenna evaluation apparatus for evaluating the performance of an antenna for use in a wireless communication apparatus, and relates to an antenna evaluation method using the same antenna evaluation apparatus.

BACKGROUND ART

In recent years, wireless terminal apparatuses for mobile communication such as mobile phones have been rapidly developed. When a radio wave arrives at a wireless terminal apparatus from a base station, the radio wave includes multipath waves produced from reflection, scattering, diffraction, or the like due to terrain, structures, and the like in its propagation path, and the radio wave has randomly changing amplitude and phase depending on the location. When receiving a radio wave from the base station as well as moving within its propagation path, fading (i.e., signal level drops, including variation in instantaneous values) occurs due to multipath propagation of the radio wave. As a result, a digital communication environment suffers from increased errors in codes and significant degradation of transmission quality. Thus, if evaluating the communication performance of a wireless terminal apparatus, it is desirable not only to evaluate its static characteristics in an RF anechoic chamber, but also to evaluate its performance in a multipath propagation environment. Hence, the applicant of the present application proposed antenna evaluation apparatuses (also referred to as "spatial multipath waves generating apparatuses" or "fading emulators") such as those described in Patent Literature 1 and Non-Patent Literatures 1 to 4.

FIG. 14 is a block diagram showing a configuration of a prior art antenna evaluation apparatus described in Patent Literature 1. The antenna evaluation apparatus includes: a plurality of transmitting antennas (referred to as "scatterer antennas" hereinafter) 121-1 to 121-7 disposed at regular intervals on the circumference of a circle with a radius r; an antenna under measurement 122 disposed near a center of the circle, such as a diversity antenna; and a control and measurement apparatus 100 connected thereto. The control and measurement apparatus 100 includes: a network analyzer 111, a divider 112, a phase-shift circuit 113, an attenuation circuit 114, a D/A converter 115, and a computer 110. The network analyzer 111 generates a radio frequency signal, and the divider 112 divides the generated radio frequency signal in accordance with the number of the scatterer antennas 121-1 to 121-7. The phase-shift circuit 113 and the attenuation circuit 114 adjust the phases and amplitudes of the divided radio frequency signals. The adjusted radio frequency signals are radiated from the scatterer antennas 121-1 to 121-7, respectively. Radio-frequency signals received by the antenna under measurement 122 are inputted to the network analyzer 111. The computer 110 controls the network analyzer 111 and controls the amounts of phase adjustments made by the phase-shift circuit 113 and the amounts of amplitude adjustments made by the attenuation circuit 114 through the D/A converter 115. The antenna evaluation apparatus controls the amplitudes and phases of radio frequency signals to be radiated from the scatterer antennas 121-1 to 121-7, and thus controls the property of a multipath propagation environment (a fading environment, etc.) which is formed around the center of the circle by the radiated radio frequency signals. Then, a performance in an actual use environment is evaluated by the antenna under measurement 122 disposed near the center of the circle.

In addition, in recent years, a MIMO (Multi-Input Multi-Output) antenna apparatus for transmitting and receiving radio signals of a plurality of channels using a plurality of antenna elements simultaneously has been developed. FIG. 15 is a schematic diagram showing a MIMO wireless communication system including: a MIMO transmitter 200 with two transmitting antennas 201 and 202; and a MIMO receiver 210 with two receiving antennas 211 and 212. The MIMO transmitter 200 converts a data stream to be transmitted into a plurality of (in this case, two) substreams, and transmits the respective substreams from corresponding transmitting antennas 201 and 202. In this case, a first substream transmitted from the transmitting antenna 201 travels through a first channel 221 and arrives at the receiving antenna 211, and travels through a second channel 222 and arrives at the receiving antenna 212. Likewise, a second substream transmitted from the transmitting antenna 202 travels through a third channel 223 and arrives at the receiving antenna 211, and travels through a fourth channel 224 and arrives at the receiving antenna 212.

Citation List

Patent Literature

PATENT LITERATURE 1: Japanese Patent Laid-open Publication No. 2005-227213.

Non-Patent Literature

NON-PATENT LITERATURE 1: Tsutomu Sakata et al., "Evaluation of Mobile Terminal Antennas using Spatial Fading Emulator", Matsushita Technical Journal, Vol. 52, No. 5, pp. 70-75, October 2006.

NON-PATENT LITERATURE 2: Tsutomu Sakata et al., "Channel Capacity Measurements of a MIMO Antenna under a Rayleigh-fading Channel by a Spatial Fading Emulator", Proceedings of the 2007 IEICE Society Conference, B-1-9, September 2007.

NON-PATENT LITERATURE 3: Tsutomu Sakata et al., "A Multipath Measurement System with a Variable Power Angular Spectrum for Handset MIMO Antennas", IEICE Technical Report, Vol. 108, No. 5, pp. 13-18, April 2008.

NON-PATENT LITERATURE 4: Tsutomu Sakata et al., "An Evaluation of the MIMO Transmission Characteristics in a Cluster Propagation Environment Using a Spatial Fading Emulator", IEICE Technical Report, Vol. 108, No. 429, pp. 121-126, April 2009.

SUMMARY OF INVENTION

Technical Problem

If using the antenna evaluation apparatus of FIG. 14 to evaluate the performance of the MIMO wireless communication system of FIG. 15, it is necessary to create different multipath propagation environments for different substreams transmitted from the MIMO transmitter, under an assumption that the substreams travel different propagation paths. In order to evaluate the performance, it is necessary to efficiently create a variety of multipath propagation environments.

An object of the present invention is to solve the above-described problem, and provide an antenna evaluation apparatus capable of efficiently creating a variety of multipath propagation environments when evaluating the performance of a receiving antenna of a MIMO wireless communication system, and provide an antenna evaluation method using the same antenna evaluation apparatus.

Solution to Problem

According to an antenna evaluation apparatus of the first aspect of the present invention, the antenna evaluation apparatus includes at least one receiving antenna to be evaluated and a plurality of scatterer antennas surrounding the receiving antenna, and the antenna evaluation apparatus is provided with: a signal generator for generating a radio frequency signal; dividing means for dividing the generated radio frequency signal; phase-shift means for adjusting phases of respective divided radio frequency signals; and control means for controlling the phase-shift means, so as to create a set of multipath waves around the receiving antenna when the adjusted radio frequency signals is respectively radiated from the scatterer antennas. The control means generates a first set of initial phases and a second set of initial phases, such that a set of multipath waves to be created around the receiving antenna by the radiated radio frequency signals, whose phases are adjusted by the phase-shift means to have corresponding initial phases in the first set of initial phases, is different from another set of multipath waves to be created around the receiving antenna by the radiated radio frequency signals, whose phases are adjusted by the phase-shift means to have corresponding initial phases in the second set of initial phases. The control means determines a third set of initial phases including arbitrary initial phases, each arbitrary initial phase between a pair of corresponding initial phases in the first set of initial phases and in the second set of initial phases. The control means adjusts the phases of the radio frequency signals using the phase-shift means such that the phases of the radio frequency signals have corresponding initial phases in the third set of initial phases, and makes the adjusted radio frequency signals radiate.

In the antenna evaluation apparatus, the control means repeats: determining a third set of initial phases, adjusting the phases of the radio frequency signals using the phase-shift means such that the phases of the radio frequency signals have corresponding initial phases in the third set of initial phases, and making the adjusted radio frequency signals radiate.

In the antenna evaluation apparatus, the control means adjusts the phases of the radio frequency signals using the phase-shift means such that the phases of the radio frequency signals have corresponding initial phases in one set of the first and second set of initial phases, and makes the adjusted radio frequency signals radiate.

In the antenna evaluation apparatus, each initial phase in the first and second sets of initial phases is generated as a random number.

According to an antenna evaluation apparatus of the second aspect of the present invention, the antenna evaluation apparatus includes at least one receiving antenna to be evaluated and a plurality of scatterer antennas surrounding the receiving antenna, and the antenna evaluation apparatus is provided with: a signal generator for generating a radio frequency signal; dividing means for dividing the generated radio frequency signal; phase-shift means for adjusting phases of respective divided radio frequency signals; and control means for controlling the phase-shift means, so as to create a set of multipath waves around the receiving antenna when the adjusted radio frequency signals is respectively radiated from the scatterer antennas. The control means changes an amount of phase shift of the phase-shift means for adjusting the phases of the radio frequency signals to be radiated from the respective scatterer antennas, based on corresponding angles of directions from the receiving antenna to positions of the respective scatterer antennas. The control means generates a first set of amounts of angular change and a second set of amounts of angular change, each set including amounts of angular change for the respective angles of the directions from the receiving antenna to the positions of the respective scatterer antennas, such that a set of multipath waves to be created around the receiving antenna by the radiated radio frequency signals, whose phases are adjusted by the phase-shift means based on corresponding amounts of angular change in the first set of amounts of angular change, is different from a set of multipath waves to be created around the receiving antenna by the radiated radio frequency signals, whose phases are adjusted by the phase-shift means based on corresponding amounts of angular change in the second set of amounts of angular change. The control means determines a third set of amounts of angular change including arbitrary amounts of angular change, each arbitrary amount of angular change between a pair of corresponding amounts of angular change in the first set of amounts of angular change and in the second set of amounts of angular change. The control means adjusts the phases of the radio frequency signals based on corresponding amounts of angular change in the third set of amounts of angular change using the phase-shift means, and makes the adjusted radio frequency signals radiate.

In the antenna evaluation apparatus, the control means repeats: determining a third set of amounts of angular change, adjusting the phases of the radio frequency signals based on corresponding amounts of angular change in the third set of amounts of angular change using the phase-shift means, and making the adjusted radio frequency signals radiate.

In the antenna evaluation apparatus, the control means adjusts the phases of the radio frequency signals based on corresponding amounts of angular change in one set of the first and second set of amounts of angular change using the phase-shift means, and makes the adjusted radio frequency signals radiate.

The antenna evaluation apparatus is further provided with first antenna drive means for moving the scatterer antennas to change the angles of the directions from the receiving antenna to the positions of the respective scatterer antennas. When the control means adjusts the phases of the radio frequency signals based on corresponding amounts of angular change in the third set of amounts of angular change using the phase-shift means, and makes the adjusted radio frequency signals radiate, the control means further moves the scatterer antennas according to the amounts of angular change in the third set of amounts of angular change using the first antenna drive means.

In the antenna evaluation apparatus, the control means adjusts the phases of the radio frequency signals based on corresponding amounts of angular change in one set of the first and second set of amounts of angular change using the phase-shift means, and makes the adjusted radio frequency signals radiate. When the control means adjusts the phases of the radio frequency signals based on corresponding amounts of angular change in one set of the first and second set of amounts of angular change using the phase-shift means, and makes the adjusted radio frequency signals radiate, the control means further moves the scatterer antennas according to the amounts of angular change in one set of the first and second set of amounts of angular change using the first antenna drive means.

In the antenna evaluation apparatus, each amount of angular change in the first and second sets of amounts of angular change is generated as a random number.

The antenna evaluation apparatus is further provided with second antenna drive means for rotating the receiving antenna to change the angles of the directions from the receiving antenna to the positions of the respective scatterer antennas. All the amounts of angular change in the first set of amounts of angular change have the same value, all the amounts of angular change in the second set of amounts of angular change have the same value, and thus, all the amounts of angular change in the third set of amounts of angular change have the same value. When the control means adjusts the phases of the radio frequency signals based on corresponding amounts of angular change in the third set of amounts of angular change using the phase-shift means, and makes the adjusted radio frequency signals radiate, the control means further rotates the receiving antenna according to the amounts of angular change in the third set of amounts of angular change using the second antenna drive means.

In the antenna evaluation apparatus, the control means adjusts the phases of the radio frequency signals based on corresponding amounts of angular change in one set of the first and second set of amounts of angular change using the phase-shift means, and makes the adjusted radio frequency signals radiate. When the control means adjusts the phases of the radio frequency signals based on corresponding amounts of angular change in one set of the first and second set of amounts of angular change using the phase-shift means, and makes the adjusted radio frequency signals radiate, the control means further rotates the receiving antenna according to the amounts of angular change in one set of the first and second set of amounts of angular change using the second antenna drive means.

In the antenna evaluation apparatus, the signal generator generates a radio frequency signal of a non-modulated continuous wave.

According to an antenna evaluation method of the third aspect of the present invention, the antenna evaluation method is provided for evaluating at least one receiving antenna to be evaluated, using an antenna evaluation apparatus including the receiving antenna and a plurality of scatterer antennas surrounding the receiving antenna. The antenna evaluation apparatus is provided with: a signal generator for generating a radio frequency signal; dividing means for dividing the generated radio frequency signal; phase-shift means for adjusting phases of respective divided radio frequency signals; and control means for controlling the phase-shift means, so as to create a set of multipath waves around the receiving antenna when the adjusted radio frequency signals is respectively radiated from the scatterer antennas. The antenna evaluation method includes the steps of: generating a first set of initial phases and a second set of initial phases, such that a set of multipath waves to be created around the receiving antenna by the radiated radio frequency signals, whose phases are adjusted by the phase-shift means to have corresponding initial phases in the first set of initial phases, is different from a set of multipath waves to be created around the receiving antenna by the radiated radio frequency signals, whose phases are adjusted by the phase-shift means to have corresponding initial phases in the second set of initial phases; determining a third set of initial phases including arbitrary initial phases, each arbitrary initial phase between a pair of corresponding initial phases in the first set of initial phases and in the second set of initial phases; and adjusting the phases of the radio frequency signals using the phase-shift means such that the phases of the radio frequency signals have corresponding initial phases in the third set of initial phases, and making the adjusted radio frequency signals radiate.

The antenna evaluation method further includes the step of repeating: determining a third set of initial phases, adjusting the phases of the radio frequency signals using the phase-shift means such that the phases of the radio frequency signals have corresponding initial phases in the third set of initial phases, and making the adjusted radio frequency signals radiate.

The antenna evaluation method further includes the steps of adjusting the phases of the radio frequency signals using the phase-shift means such that the phases of the radio frequency signals have corresponding initial phases in one set of the first and second set of initial phases, and making the adjusted radio frequency signals radiate.

In the antenna evaluation method, each initial phase in the first and second sets of initial phases is generated as a random number.

According to an antenna evaluation method of the fourth aspect of the present invention, the antenna evaluation method is provided for evaluating at least one receiving antenna to be evaluated, using an antenna evaluation apparatus including the receiving antenna and a plurality of scatterer antennas surrounding the receiving antenna. The antenna evaluation apparatus is provided with: a signal generator for generating a radio frequency signal; dividing means for dividing the generated radio frequency signal; phase-shift means for adjusting phases of respective divided radio frequency signals; and control means for controlling the phase-shift means, so as to create a set of multipath waves around the receiving antenna when the adjusted radio frequency signals is respectively radiated from the scatterer antennas. The antenna evaluation method including the steps of: changing an amount of phase shift of the phase-shift means for adjusting the phases of the radio frequency signals to be radiated from the respective scatterer antennas, based on corresponding angles of directions from the receiving antenna to positions of the respective scatterer antennas; generating a first set of amounts of angular change and a second set of amounts of angular change, each set including amounts of angular change for the respective angles of the directions from the receiving antenna to the positions of the respective scatterer antennas, such that a set of multipath waves to be created around the receiving antenna by the radiated radio frequency signals, whose phases are adjusted by the phase-shift means based on corresponding amounts of angular change in the first set of amounts of angular change, is different from a set of multipath waves to be created around the receiving antenna by the radiated radio frequency signals, whose phases are adjusted by the phase-shift means based on corresponding amounts of angular change in the second set of amounts of angular change; determining a third set of amounts of angular change including arbitrary amounts of angular change, each arbitrary amount of angular change between a pair of corresponding amounts of angular change in the first set of amounts of angular change and in the second set of amounts of angular change; and adjusting the phases of the radio frequency signals based on corresponding amounts of angular change in the third set of amounts of angular change using the phase-shift means, and making the adjusted radio frequency signals radiate.

The antenna evaluation method further includes the step of repeating: determining a third set of amounts of angular change, adjusting the phases of the radio frequency signals based on corresponding amounts of angular change in the third set of amounts of angular change using the phase-shift means, and making the adjusted radio frequency signals radiate.

The antenna evaluation method further includes the steps of adjusting the phases of the radio frequency signals based on corresponding amounts of angular change in one set of the first and second set of amounts of angular change using the phase-shift means, and making the adjusted radio frequency signals radiate.

In the antenna evaluation method, the antenna evaluation apparatus is further provided with first antenna drive means for moving the scatterer antennas to change the angles of the directions from the receiving antenna to the positions of the respective scatterer antennas. The antenna evaluation method further includes the step of further moving the scatterer antennas according to the amounts of angular change in the third set of amounts of angular change using the first antenna drive means, when adjusting the phases of the radio frequency signals based on corresponding amounts of angular change in the third set of amounts of angular change using the phase-shift means, and making the adjusted radio frequency signals radiate.

The antenna evaluation method further includes the steps of: adjusting the phases of the radio frequency signals based on corresponding amounts of angular change in one set of the first and second set of amounts of angular change using the phase-shift means, and makes the adjusted radio frequency signals radiate; and further moving the scatterer antennas according to the amounts of angular change in one set of the first and second set of amounts of angular change using the first antenna drive means, when adjusting the phases of the radio frequency signals based on corresponding amounts of angular change in one set of the first and second set of amounts of angular change using the phase-shift means, and making the adjusted radio frequency signals radiate.

In the antenna evaluation method, each amount of angular change in the first and second sets of amounts of angular change is generated as a random number.

In the antenna evaluation method, the antenna evaluation apparatus is further provided with second antenna drive means for rotating the receiving antenna to change the angles of the directions from the receiving antenna to the positions of the respective scatterer antennas. All the amounts of angular change in the first set of amounts of angular change have the same value, all the amounts of angular change in the second set of amounts of angular change have the same value, and thus, all the amounts of angular change in the third set of amounts of angular change have the same value. The antenna evaluation method further includes the step of further rotating the receiving antenna according to the amounts of angular change in the third set of amounts of angular change using the second antenna drive means, when adjusting the phases of the radio frequency signals based on corresponding amounts of angular change in the third set of amounts of angular change using the phase-shift means, and making the adjusted radio frequency signals radiate.

The antenna evaluation method further includes the steps of: adjusting the phases of the radio frequency signals based on corresponding amounts of angular change in one set of the first and second set of amounts of angular change using the phase-shift means, and makes the adjusted radio frequency signals radiate; and further rotating the receiving antenna according to the amounts of angular change in one set of the first and second set of amounts of angular change using the second antenna drive means, when adjusting the phases of the radio frequency signals based on corresponding amounts of angular change in one set of the first and second set of amounts of angular change using the phase-shift means, and making the adjusted radio frequency signals radiate.

In the antenna evaluation method, the signal generator generates a radio frequency signal of a non-modulated continuous wave.

ADVANTAGEOUS EFFECTS OF INVENTION

The antenna evaluation apparatuses of the present invention can efficiently create a variety of multipath propagation environments when evaluating the performance of a receiving antenna of a MIMO wireless communication system.

DESCRIPTION OF EMBODIMENTS

Figure 1:
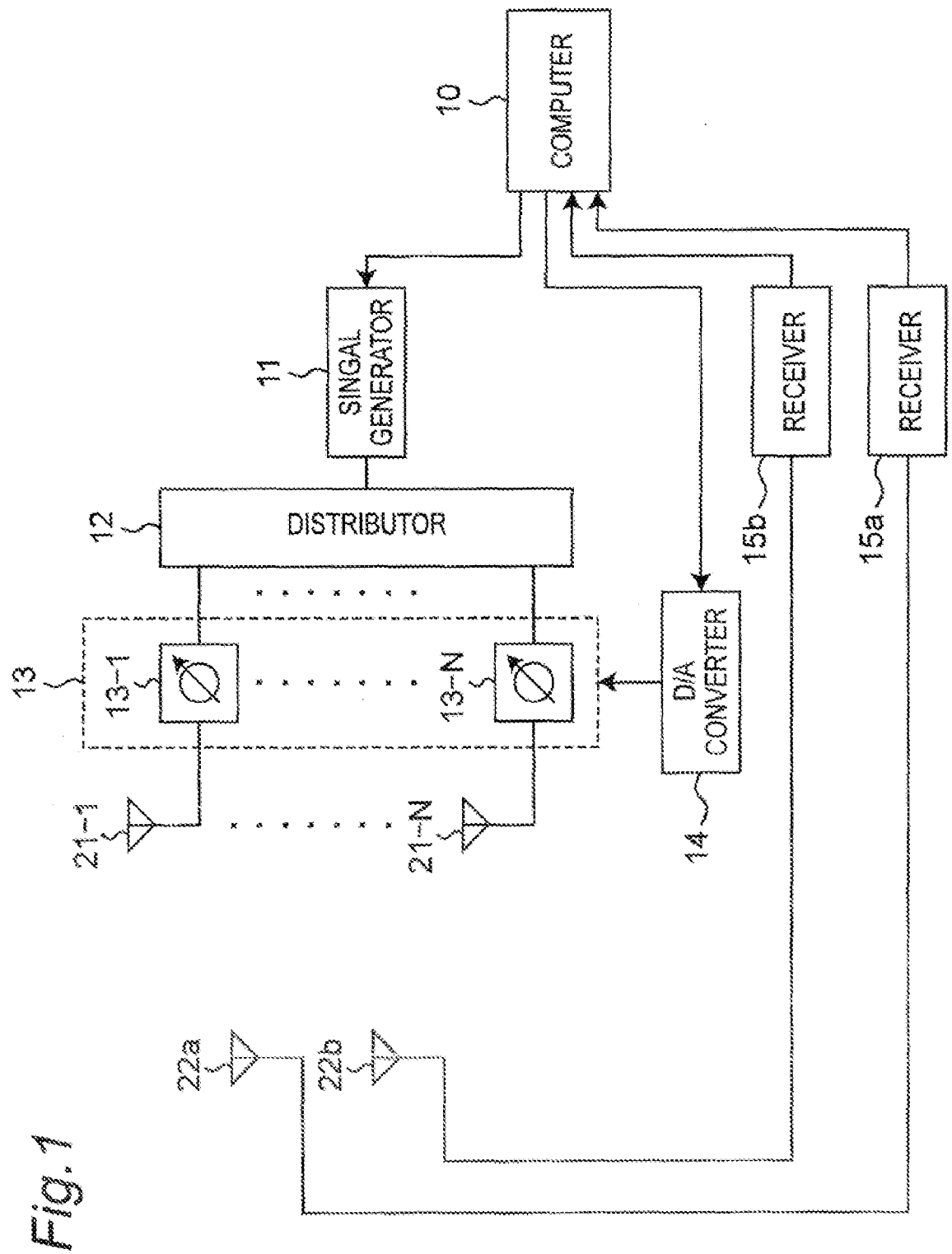
FIG. 1 is a block diagram showing a configuration of an antenna evaluation apparatus according to a first embodiment of the present invention.

Embodiments according to the present invention will be described below with reference to the drawings. Note that in the following embodiments like components are denoted by the same reference numerals.

First Embodiment.

FIG. 1 is a block diagram showing a configuration of an antenna evaluation apparatus according to a first embodiment of the present invention. The antenna evaluation apparatus includes: two receiving antennas 22a and 22b disposed to be close to each other; and a plurality of scatterer antennas 21-1 to 21-N disposed to surround the receiving antennas 22a and 22b. In the present embodiment, the two receiving antennas 22a and 22b are provided as, for example, receiving antennas of a MIMO receiver to be evaluated, and the surrounding scatterer antennas 21-1 to 21-N create a multipath propagation environment around the receiving antennas 22a and 22b. In the antenna evaluation apparatus, a signal generator 11 generates a radio frequency signal which is a non-modulated continuous wave (CW). Then, a divider 12 divides the generated radio frequency signal into N radio frequency signals in accordance with the number of the scatterer antennas 21-1 to 21-N. A phase-shift circuit 13 includes phase shifters 13-1 to 13-N, each adjusting the phase of a corresponding divided radio frequency signal. The adjusted radio frequency signals are radiated from corresponding scatterer antennas 21-1 to 21-N. The radiated N radio frequency signals are superposed as multipath waves around the center space surrounded by the scatterer antennas 21-1 to 21-N, and the multipath waves arrive at the receiving antennas 22a and 22b. The radio frequency signals having arrived at the receiving antennas 22a and 22b are measured by receivers 15a and 15b, respectively. A computer 10 controls the signal generator 11 and controls the amounts of phase adjustments made by the phase-shift circuit 13 through a D/A converter 14. The computer 10 also obtains results of the measurement of the radio frequency signals from the receivers 15a and 15b. The signal generator 11 synchronizes with the receivers 15a and 15b in a well known manner. In addition, for example, the signal generator 11 and the receiver 15a may be configured as a network analyzer and the receiver 15b may be configured as another network analyzer. The antenna evaluation apparatus is preferably set up in an RF anechoic chamber. Accordingly, the influence of reflected waves, which are reflected off the ceiling, floor, walls, etc., is sufficiently reduced over direct waves, and multipath waves made of direct waves radiated from the scatterer antennas 21-1 to 21-N are created around the receiving antennas 22a and 22b.

The antenna evaluation apparatus of the present embodiment is characterized in that the computer 10 generates a first set of initial phases and a second set of initial phases, each set corresponding to a different set of multipath waves; determines a third set of initial phases including arbitrary initial phases, each arbitrary initial phase between a pair of corresponding initial phases in the first set of initial phases and in the second set of initial phases; adjusts a plurality of radio frequency signals using the phase-shift circuit 13 such that the plurality of radio frequency signals have corresponding initial phases in the third set of initial phases, and makes the plurality of radio frequency signals radiate. Accordingly, the antenna evaluation apparatus of the present embodiment can create a variety of multipath propagation environments. If sets of multipath waves arriving at the receiving antennas 22a and 22b under different multipath propagation environments are regarded as substreams transmitted from a MIMO transmitter, the antenna evaluation apparatus of the present embodiment can be used for evaluating the performance of receiving antennas of a MIMO wireless communication system. In addition, the antenna evaluation apparatus of the present embodiment can efficiently create a variety of multipath propagation environments when evaluating the performance of the receiving antennas of the MIMO wireless communication system.

Figure 2:
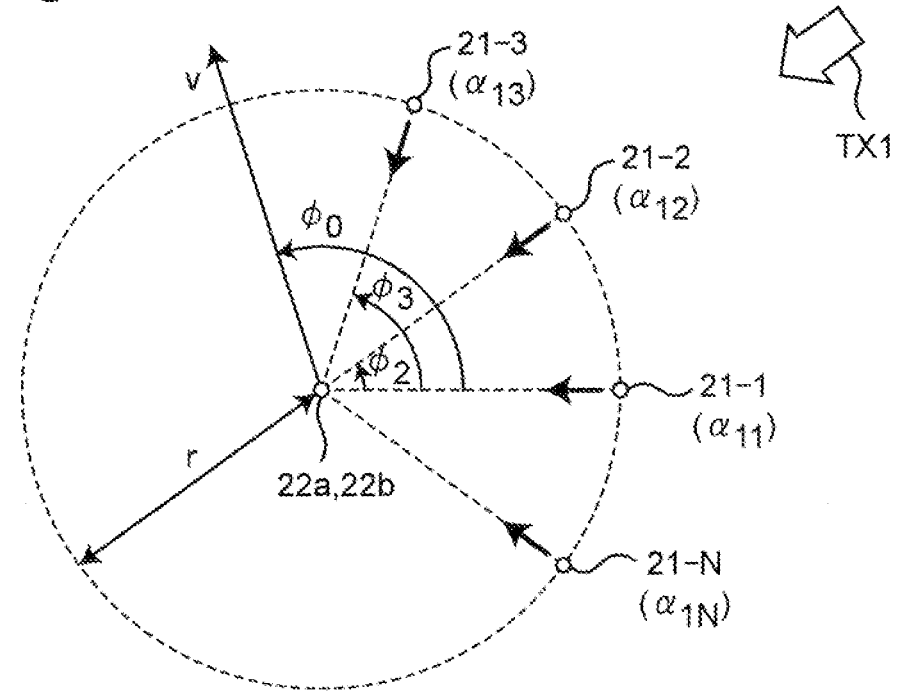
FIG. 2 is a plan view showing an antenna arrangement of the antenna evaluation apparatus of FIG. 1 and a multipath propagation environment with a first initial phase vector $A_1$ being set.
Figure 14:
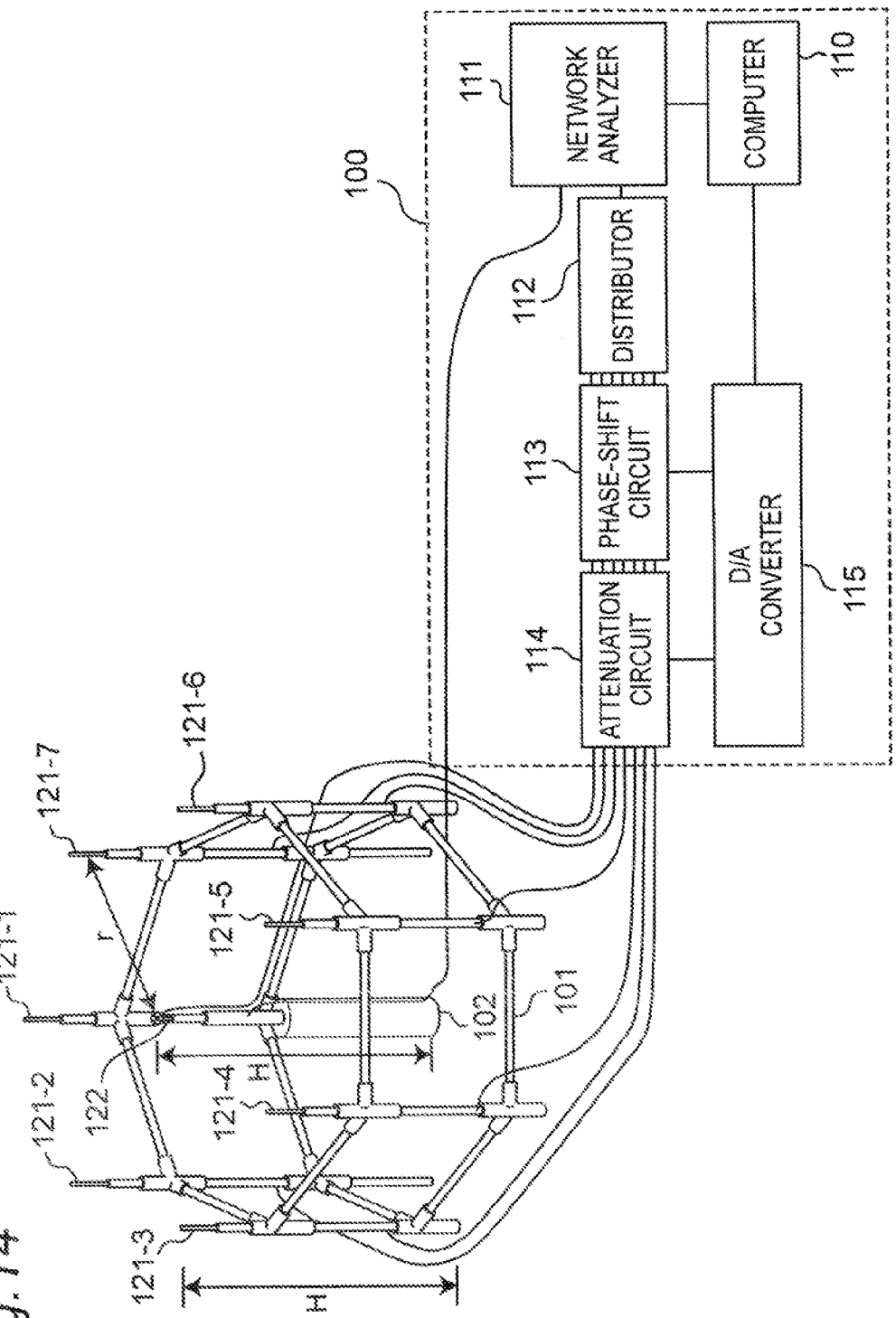
FIG. 14 is a block diagram showing a configuration of a prior art antenna evaluation apparatus.

As shown in FIG. 2, the scatterer antennas 21-1 to 21-N are disposed on the circumference of a circle with a radius r so as to be spaced in angle from each other, and the two receiving antennas 22a and 22b are disposed near a center of the circle. Let a direction of the scatterer antenna 21-1 from the center of the circle have an angle $\phi_1=0$ as a reference direction, let a direction of the scatterer antenna 21-2 have an angle $\phi_2$, let a direction of the scatterer antenna 21-3 have an angle $\phi_3$, and similarly, let a direction of the scatterer antenna 21-N have an angle $\phi_N$. The arrangement of the scatterer antennas 21-1 to 21-N is not limited to that shown in FIG. 2, and any arrangement may be used as long as a desired set of multipath waves can be created around the receiving antennas 22a and 22b. For example, the scatterer antennas 21-1 to 21-N may be disposed on the circumference of a circle at an equal angular width. The receiving antennas 22a and 22b are spaced apart from each other by a distance (e.g., a distance equal to a half wavelength of radio frequency signals to be received) according to the structure of a MIMO receiver to be evaluated. The scatterer antennas 21-1 to 21-N are mounted at a height H from the floor, e.g., using a scatterer antenna support 101 shown in FIG. 14. Likewise, the receiving antennas 22a and 22 are mounted at the height H from the floor, e.g., using a receiving antenna support 102 shown in FIG. 14. In the present embodiment, each of the scatterer antennas 21-1 to 21-N and the receiving antennas 22a and 22b is configured as, for example, a half-wavelength dipole antenna, but is not limited thereto. In addition, each of the scatterer antennas 21-1 to 21-N and the receiving antennas 22a and 22b is mounted, for example, vertically to the floor and transmits and receives vertically polarized radio waves, but the arrangement is not limited thereto.

When using radio frequency signals in a frequency band, e.g., about 2 GHz, the height H of the scatterer antennas 21-1 to 21-N and the receiving antennas 22a and 22b from the floor is set to 1.5 m, and the distance between the scatterer antennas 21-1 to 21-N and the receiving antennas 22a and 22b, i.e., the radius r of the circumference on which the scatterer antennas 21-1 to 21-N are disposed, is set to 1.5 m. The available frequency band and antenna arrangement are not limited thereto, and other values may be used.

The operating principles of the antenna evaluation apparatus according to the embodiment of the present invention will be described below.

(Creation of a Multipath Propagation Environment Including Fading)

The antenna evaluation apparatus of the present embodiment can virtually produce the same fading as the fading occurring according to movement of the receiving antennas 22a and 22b. In this case, the computer 10 can control fading characteristics by independently and instantaneously controlling the phases of N radio frequency signals using the phase-shift circuit 13. That is, by controlling the phase changes of radio frequency signals to be radiated from the scatterer antennas 21-1 to 21-N, respectively, it is possible to create a superposition of multipath waves with variations due to fading (e.g., Rayleigh fading or other fading) around the center. It is assumed that, as shown in FIG. 2, the receiving antennas 22a and 22b move in the direction of an angle $\phi_0$ at a velocity v. In this case, a phase $p_i(t)$ of a radio frequency signal to be radiated from an i-th scatterer antenna 21-i ($i \leq 1 \leq N$) is adjusted by a phase shifter 13-i, as follows.

$$p_i(t) = 2\pi \cdot t \cdot f_D \cos(\phi_0 - \phi_i) + \alpha_i \qquad \text{[Equation 1]}$$

In Equation 1, $f_D$ is the maximum Doppler frequency $v/\lambda$ for the wavelength of the radio frequency signal $\lambda$, t is the time, and $\alpha_i$ is the initial phase of the radio frequency signal to be radiated from the scatterer antenna 21-i. The maximum Doppler frequency $f_D$ can be set to any value ranging from a value corresponding to walking (several Hz) to a value corresponding to high-speed movement (several hundred Hz). As can be seen from Equation 1, the rate at which the phase shifter 13-i changes the phase changes depending on the value of the maximum Doppler frequency $f_D$. When the maximum Doppler frequency $f_D$ is low, the rate is also low; on the other hand, when the maximum Doppler frequency $f_D$ is high, the rate is also high. The angle $\phi_0$ of a virtual traveling direction can be set to any value. When the angle $\phi_0$ is changed, the conditions for Doppler shift associated with the scatterer antenna 21-i also change, and accordingly, the amount of phase adjustment made by the phase shifter 13-i is changed. According to Equation 1, the phase $p_i(t)$ has an initial phase $\alpha_i$, and changes over time depending on the maximum Doppler frequency $f_D$ and depending on the angular difference between the angle $\phi_0$ of the virtual traveling direction and an angle $\phi_i$ of a direction of the scatterer antenna 21-i.

(Received Signal Waveforms at the Receiving Antennas 22a and 22b)

When fading is produced using radio frequency signals with the phase $p_i(t)$ of Equation 1, a set of multipath waves created around the center surrounded by the scatterer antennas 21-1 to 21-N has the following received signal waveform S(t) upon reception.

$$S(t) = \sum_{i=1}^{N} \frac{\lambda}{4\pi \cdot r} \exp[-j\{\beta r + p_i(t)\}] \quad \text{[Equation 2]}$$

$$= \sum_{i=1}^{N} \frac{\lambda}{4\pi \cdot r} \exp[-j\{\beta r + 2\pi \cdot t \cdot f_D \cos(\phi_0 - \phi_i) + \alpha_i\}]$$

In Equation 2, $\beta$ is the propagation constant. In addition, in the present embodiment, it is assumed that incoming waves are uniformly distributed over all azimuth angles. Furthermore, it is assumed that each of the receiving antennas 22a and 22b has an omni-directional radiation pattern.

Thus, the antenna evaluation apparatus of the present embodiment provides radio frequency signals to be radiated with the same phase changes as phase changes of incoming waves occurring according to a user's actual movement, and thus, creates a desired set of multipath waves around the center. As a result, it is possible to create a situation in which the receiving antennas 22a and 22b are moving, in spite of that the receiving antennas 22a and 22b are actually fixed.

In the present embodiment, under an assumption that each substream transmitted from a MIMO transmitter travels independent propagation paths, different multipath propagation environments are created for different substreams. In particular, in the present embodiment, the initial phase $\alpha_i$ in Equation 2 is changed so as to create different multipath propagation environments. The computer 10 independently and randomly generates two different sets of initial phases $\alpha_{1i}$ and $\alpha_{2i}$ ($1 \leq i \leq N$). In this specification, these sets of initial phases are referred to as "initial phase vectors $A_1 = (\alpha_{11}, \ldots, \alpha_{1N})$ and $A_2 = (\alpha_{21}, \ldots, \alpha_{2N})$" hereinafter. These different initial phase vectors $A_1$ and $A_2$ correspond to different multipath propagation environments (i.e., different propagation paths), and eventually, create different sets of multipath waves around the receiving antennas 22a and 22b. That is, by substituting the initial phases $\alpha_{1i}$ and $\alpha_{2i}$ into Equation 2, the following two received signal waveforms $S_1(t)$ and $S_2(t)$ are obtained.

$$S_1(t) = \sum_{i=1}^{N} \frac{\lambda}{4\pi \cdot r} \exp[-j\{\beta r + 2\pi \cdot t \cdot f_D \cos(\phi_0 - \phi_i) + \alpha_{1i}\}] \quad \text{[Equation 3]}$$

$$S_2(t) = \sum_{i=1}^{N} \frac{\lambda}{4\pi \cdot r} \exp[-j\{\beta r + 2\pi \cdot t \cdot f_D \cos(\phi_0 - \phi_i) + \alpha_{2i}\}] \quad \text{[Equation 4]}$$

FIG. 2 is a plan view showing an antenna arrangement of the antenna evaluation apparatus of FIG. 1 and a multipath propagation environment with the first initial phase vector $A_1$ being set. The phases of radio frequency signals to be radiated from the scatterer antennas 21-i, respectively, are adjusted to have corresponding initial phases $\alpha_{1i}$. The radio frequency signals radiated with the initial phases $\alpha_{1i}$ arrive at each of the receiving antennas 22a and 22b as a set of multipath waves having a certain arrival waveform. The set of multipath waves can be regarded as a first substream TX1 that is transmitted from, for example, a first transmitting antenna of a MIMO transmitter with two transmitting antennas (see FIG. 15), travels certain propagation paths, and arrives thereto. Furthermore, the set of multipath waves substantially has a received signal waveform corresponding to the received signal waveform $S_1(t)$ of Equation 3, when received by each of the receiving antennas 22a and 22b. The received signal waveforms actually differ from one another due to the differences in the positions and directional patterns of the receiving antennas 22a and 22b, etc. Therefore, when the antenna evaluation apparatus of the present embodiment creates multipath propagation environments according to a MIMO wireless communication system of FIG. 15, signals radiated under the first initial phase vector $A_1$ and received by the receiving antenna 22a correspond to signals traveling the channel 221 from the transmitting antenna 201 to the receiving antenna 211, and signals radiated under the first initial phase vector $A_1$ and received by the receiving antenna 22b correspond to signals traveling the channel 222 from the transmitting antenna 201 to the receiving antenna 212.

Figure 3:
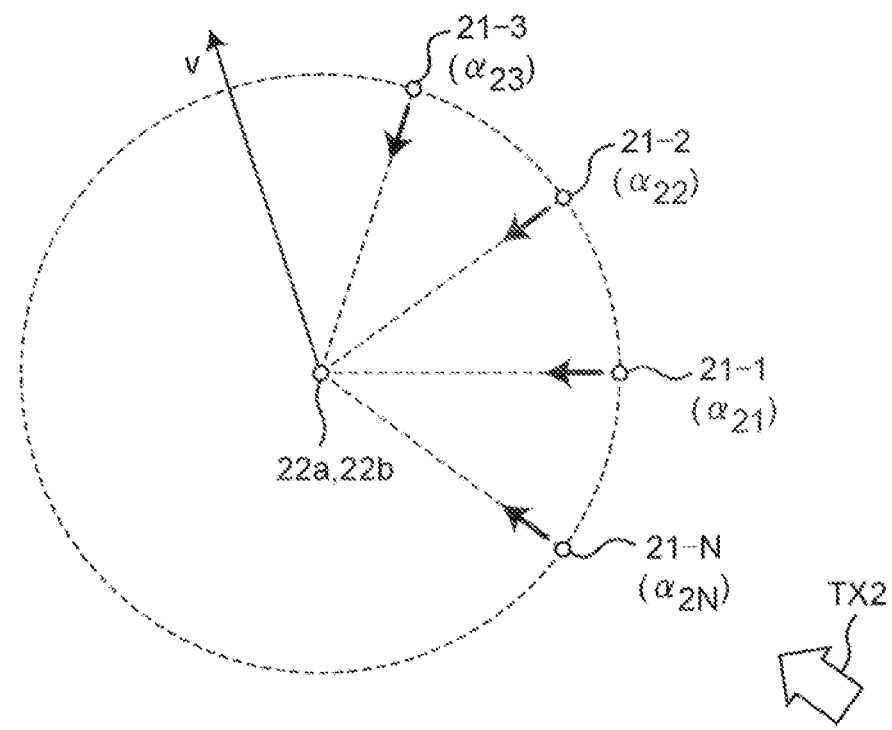
FIG. 3 is a plan view showing an antenna arrangement of the antenna evaluation apparatus of FIG. 1 and a multipath propagation environment with a second initial phase vector $A_2$ being set.

FIG. 3 is a plan view showing an antenna arrangement of the antenna evaluation apparatus of FIG. 1 and a multipath propagation environment with the second initial phase vector $A_2$ being set. The phases of radio frequency signals to be radiated from the scatterer antennas 21-i, respectively, are adjusted to have corresponding initial phases $\alpha_{2i}$ which are different from the initial phases $\alpha_{1i}$. The radio frequency signals radiated with the initial phases $\alpha_{2i}$ arrive at each of the receiving antennas 22a and 22b as a set of multipath waves having a certain arrival waveform. The set of multipath waves can be regarded as a second substream TX2 that is different from the first substream TX1 and that is transmitted from, for example, a second transmitting antenna of the MIMO transmitter with two transmitting antennas (see FIG. 15), travels certain propagation paths different from that of the first substream TX1, and arrives thereto. Furthermore, the set of multipath waves substantially has a received signal waveform corresponding to the received signal waveform $S_2(t)$ of Equation 4, when received by each of the receiving antennas 22a and 22b. The received signal waveforms actually differ from one another due to the differences in the positions and directional patterns of the receiving antennas 22a and 22b, etc. Therefore, when the antenna evaluation apparatus of the present embodiment creates multipath propagation environments according to the MIMO wireless communication system of FIG. 15, signals radiated under the second initial phase vector $A_2$ and received by the receiving antenna 22a correspond to signals traveling the channel 223 from the transmitting antenna 202 to the receiving antenna 211, and signals radiated under the second initial phase vector $A_2$ and received by the receiving antenna 22b correspond to signals traveling the channel 224 from the transmitting antenna 202 to the receiving antenna 212.

As shown in FIGS. 2 and 3, it is possible to create different multipath propagation environments by setting different initial phase vectors.

The antenna evaluation apparatus of the present embodiment can obtain channel responses of, for example, the MIMO wireless communication system using two transmitting antennas and two receiving antennas shown in FIG. 15, as follows. A channel response h11 of the channel 221 is calculated based on signals radiated under the first initial phase vector $A_1$ and received by the receiving antenna 22a, and a channel response h21 of the channel 222 is calculated based on signals radiated under the first initial phase vector $A_1$ and received by the receiving antenna 22b. Subsequently, a channel response h12 of the channel 223 is calculated based on signals radiated under the second initial phase vector $A_2$ different from the first initial phase vector $A_1$ and received by the receiving antenna 22a, and a channel response h22 of the channel 224 is calculated based on signals radiated under the second initial phase vector $A_2$ and received by the receiving antenna 22b. By combining these channel responses h11, h21, h12, and h22 obtained separately, the following channel response matrix H is obtained.

$$H = \begin{bmatrix} h_{11} & h_{12} \\ h_{21} & h_{22} \end{bmatrix} \quad \text{[Equation 5]}$$

(Control of the Initial Phase Using a Parameter k)

In order for the antenna evaluation apparatus to evaluate the performance of an antenna apparatus, it is necessary to create a variety of multipath propagation environments. In the present embodiment, under an assumption that different substreams TX1 and TX2 transmitted from the MIMO transmitter travel independent propagation paths as described above, different multipath propagation environments are created for the different substreams TX1 and TX2. When the substreams TX1 and TX2 travel the same propagation paths, the correlation between a multipath propagation environment for the substream TX1 and a multipath propagation environment for the substream TX2 is high. On the other hand, when the substreams TX1 and TX2 travel different propagation paths, the correlation is low. In addition, an environment having an intermediate correlation is also assumed. Therefore, it is desirable to create these multipath propagation environments so as to change the correlation between the multipath propagation environment for the substream TX1 and the multipath propagation environment for the substream TX2 to obtain a variety of correlation values. In the present embodiment, in order to achieve the creation of such multipath propagation environments, an initial phase vector B between two different initial phase vectors $A_1$ and $A_2$ is defined using a parameter k ($0 \leq k \leq 1$), as follows.

$$B = k \cdot A_1 + (1-k) \cdot A_2 \quad \text{[Equation 6]}$$

By changing the parameter k in Equation 6, initial phase vectors B having various different values are obtained. By radiating radio frequency signals with these initial phase vectors B being set, various and different multipath propagation environments are created. Accordingly, a set of multipath waves arriving at the receiving antennas 22a and 22b with an initial phase vector defined by Equation 6 being set can be regarded as a first substream TX1 transmitted from the MIMO transmitter, and a set of multipath waves arriving at the receiving antennas 22a and 22b with another initial phase vector defined by Equation 6 being set can be regarded as a second substream TX2 transmitted from the MIMO transmitter. When an arbitrary initial phase vector (e.g., the initial phase vector $A_1$ or $A_2$, or any initial phase vector B defined by Equation 6) is used as a reference initial phase vector, the other initial phase vectors have certain distances from the reference initial phase vector. According to these distances, the correlation between corresponding multipath propagation environments changes. The shorter the distance between the two initial phase vectors are, the higher the correlation between corresponding multipath propagation environments is. The longer the distance between the two initial phase vectors, the lower the correlation between corresponding multipath propagation environments is. In the present embodiment, a cross-correlation coefficient between multipath wave signals arriving at the receiving antenna 22a (or 22b) with one initial phase vector being set and multipath wave signals arriving at the receiving antenna 22a (or 22b) with the other initial phase vector being set is used as a correlation between two multipath propagation environments. In this case, when the former signals are denoted by a signal sequence $x=(x_1, x_2, \ldots, x_m)$ and the latter signals are denoted by a signal sequence $y=(y_1, y_2, \ldots, y_m)$, their cross-correlation coefficient can be defined using a Pearson's product-moment correlation $\rho_{xy}$, as follows.

$$\rho_{xy} = \frac{\sum_{i=1}^{m}(x_i - \bar{x})(y_i - \bar{y})}{\sqrt{\sum_{i=1}^{m}(x_i - \bar{x})^2} \sqrt{\sum_{i=1}^{m}(y_i - \bar{y})^2}} \quad \text{[Equation 7]}$$

Figure 4:
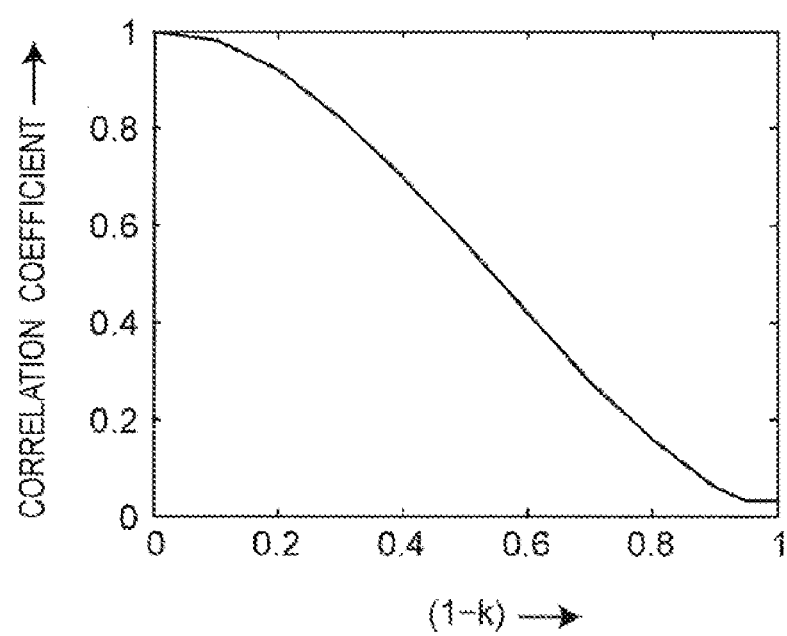
FIG. 4 is a graph of a cross-correlation coefficient between two received signal waveforms versus a parameter (1−k) set by a computer 10 of FIG. 1.

FIG. 4 is a graph a cross-correlation coefficient between two received signal waveforms versus a parameter (1−k) set by the computer 10 of FIG. 1. In this case, one of two created multipath propagation environments uses the fixed initial phase vector $A_1$, and the other of two created multipath propagation environments uses the variable initial phase vector B according to the changes of the parameter k in Equation 6. The graph of FIG. 4 shows a result obtained by acquiring signal sequences over a certain period of time as sampled signal sets of multipath waves arriving at the receiving antenna 22a (see Equation 2) with the respective initial phase vectors $A_1$ and B being set, and then calculating their cross-correlation coefficient using Equation 7. According to FIG. 4, by changing the parameter k, it is possible to change the correlation between two multipath propagation environments to obtain a variety of correlation values. Accordingly, it can be seen that a variety of multipath propagation environments with various and different cross-correlations can be efficiently created.

As described above, since the initial phase vectors $A_1$ and $A_2$ are generated randomly and independently, the correlation between multipath propagation environments with the respective initial phase vectors $A_1$ and $A_2$ being set is 0. Thus, when a reference multipath propagation environment is created using one of the initial phase vectors $A_1$ and $A_2$ and another multipath propagation environment is created using the initial phase vector B, the initial phase vector B matches either one of the initial phase vectors $A_1$ and $A_2$ or takes a value therebetween, according to the change of the parameter k, and thus, the correlation between the multipath propagation environments can be arbitrarily changed from 0 to 1. In this case, the correlation can be changed in a wide range, and thus it is favorable. However, a reference multipath propagation environment may be created using any initial phase vector B between the initial phase vectors $A_1$ and $A_2$ and different from the initial phase vectors $A_1$ and $A_2$.

In the case that a radio frequency signal which is a non-modulated continuous wave (CW) is used, even if using a plurality of signal generators, it is not possible to simultaneously transmit a plurality of orthogonal and uncorrelated signals, as does a MIMO transmitter. However, if sets of multipath waves arriving at the receiving antennas 22a and 22b under different multipath propagation environments are regarded as substreams transmitted from a MIMO transmitter, the antenna evaluation apparatus of the present embodiment can be used for evaluating the performance of receiving antennas of a MIMO wireless communication system.

As described above, the antenna evaluation apparatus of the present embodiment is characterized by: generating initial phase vectors $A_1$ and $A_2$ corresponding to different sets of multipath waves; determining an initial phase vector B between the initial phase vectors $A_1$ and $A_2$, and adjusting the plurality of radio frequency signals using the phase-shift circuit 13 such that the plurality of radio frequency signal have corresponding initial phases in the initial phase vector B; and making the plurality of radio frequency signals radiate. The antenna evaluation apparatus of the present embodiment may further repeat determining an initial phase vector B, adjusting the plurality of radio frequency signals using the phase-shift circuit 13 such that the plurality of radio frequency signals have corresponding initial phases in the initial phase vector B, and making the plurality of adjusted radio frequency signals radiate. Accordingly, the antenna evaluation apparatus of the present embodiment can efficiently create a variety of multipath propagation environments when evaluating the performance of receiving antennas of a MIMO wireless communication system.

Second Embodiment.

In the first embodiment, the initial phase vector is changed in order to create different multipath propagation environments. Alternatively, a second embodiment is characterized by changing the positions of scatterer antennas 21-1 to 21-N.

Figure 5:
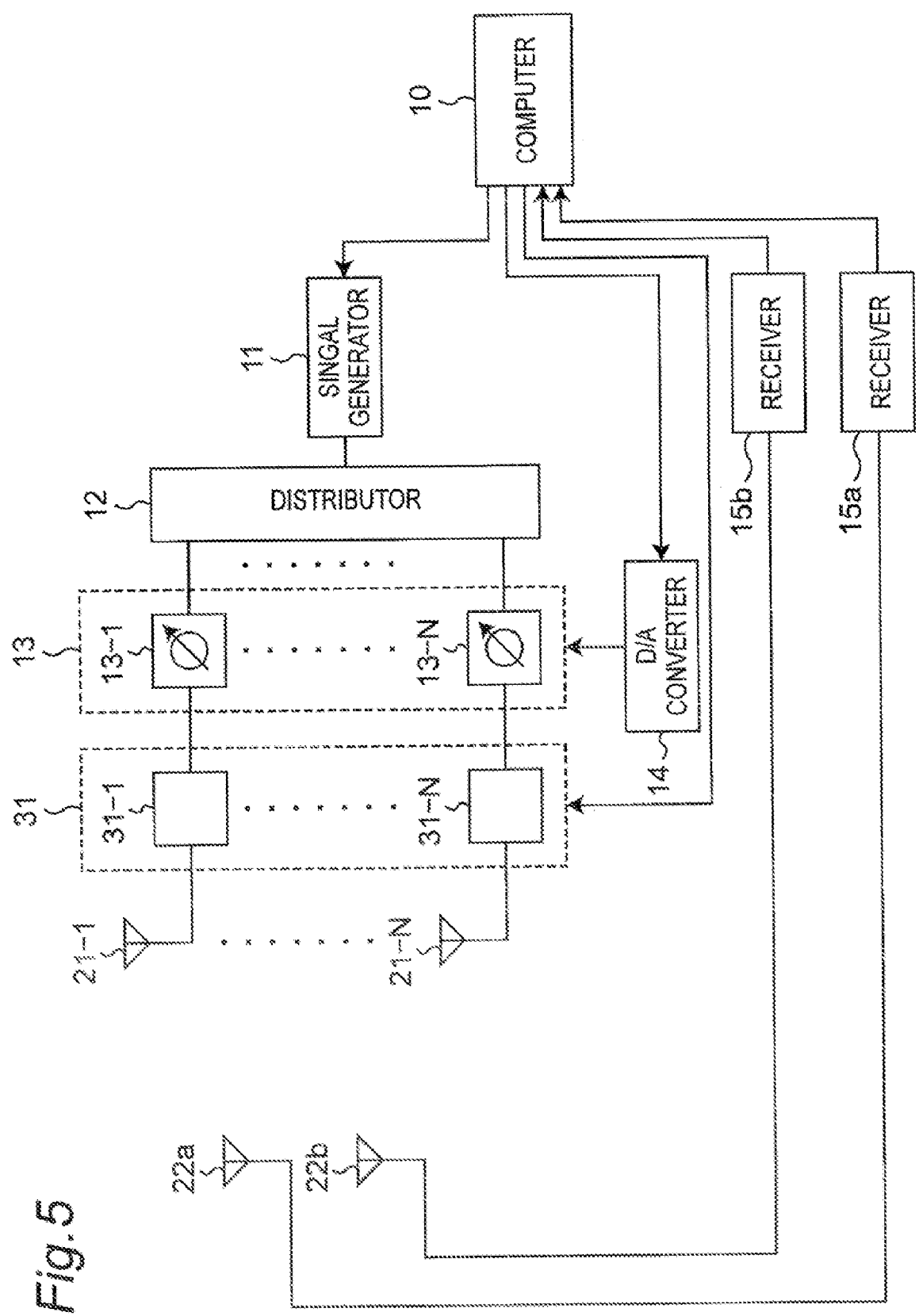
FIG. 5 is a block diagram showing a configuration of an antenna evaluation apparatus according to a second embodiment of the present invention.
Figure 6:
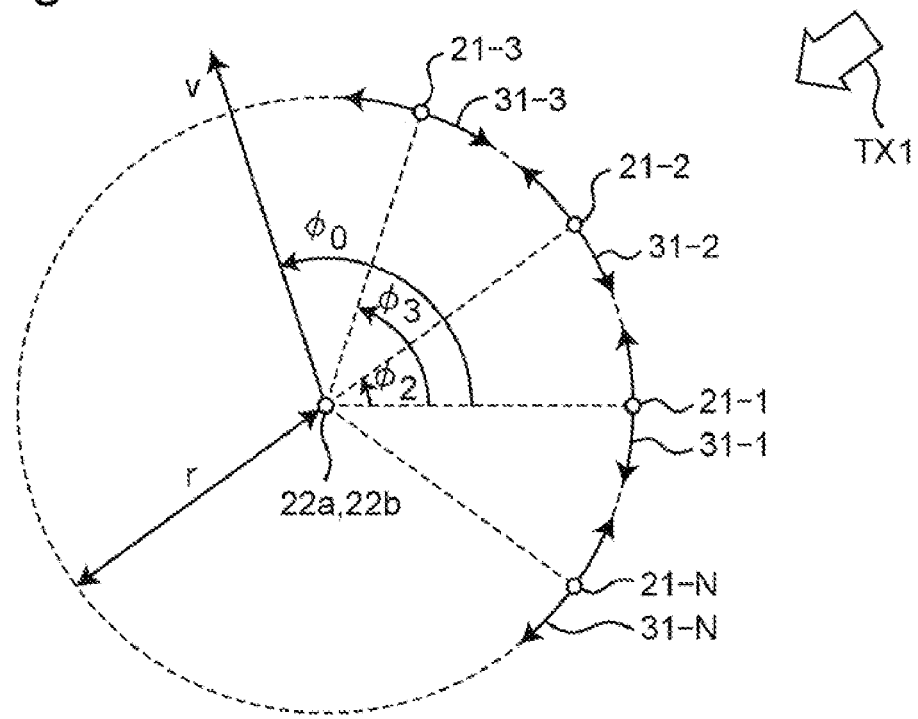
FIG. 6 is a plan view showing an antenna arrangement of the antenna evaluation apparatus of FIG. 5 and a multipath propagation environment with first scatterer antenna positions being set.

FIG. 5 is a block diagram showing a configuration of an antenna evaluation apparatus according to the second embodiment of the present invention. the antenna evaluation apparatus of the present embodiment has the same configuration as that of the antenna evaluation apparatus of FIG. 1, and further includes antenna drive apparatuses 31-1 to 31-N (collectively indicated by the reference numeral "31") for changing the positions of their corresponding scatterer antennas 21-1 to 21-N, i.e., the angles of the scatterer antennas 21-1 to 21-N seen from receiving antennas 22a and 22b. As shown in FIG. 6, the scatterer antennas 21-1 to 21-N are disposed on the circumference of a circle with a radius r so as to be spaced in angle from each other, and the two receiving antennas 22a and 22b are disposed near a center of the circle. The scatterer antennas 21-1 to 21-N are mechanically moved along the circumference by a certain angular width, by their corresponding antenna drive apparatuses 31-1 to 31-N. A computer 10 controls the antenna drive apparatuses 31-1 to 31-N to mechanically move the scatterer antennas 21-1 to 21-N to desired positions.

FIG. 6 is a plan view showing an antenna arrangement of the antenna evaluation apparatus of FIG. 5 and a multipath propagation environment with first scatterer antenna positions being set. The arrangement shown in FIG. 6 corresponds to the case in which the respective scatterer antennas 21-1 to 21-N are moved by the angle of 0. Radio-frequency signals radiated from the scatterer antennas 21-1 to 21-N as shown in FIG. 6 arrive at each of the receiving antennas 22a and 22b as a set of multipath waves. The set of multipath waves can be regarded as a first substream TX1 that is transmitted from, for example, a first transmitting antenna of a MIMO transmitter with two transmitting antennas (see FIG. 15), travels certain propagation paths, and arrives thereto.

Figure 7:
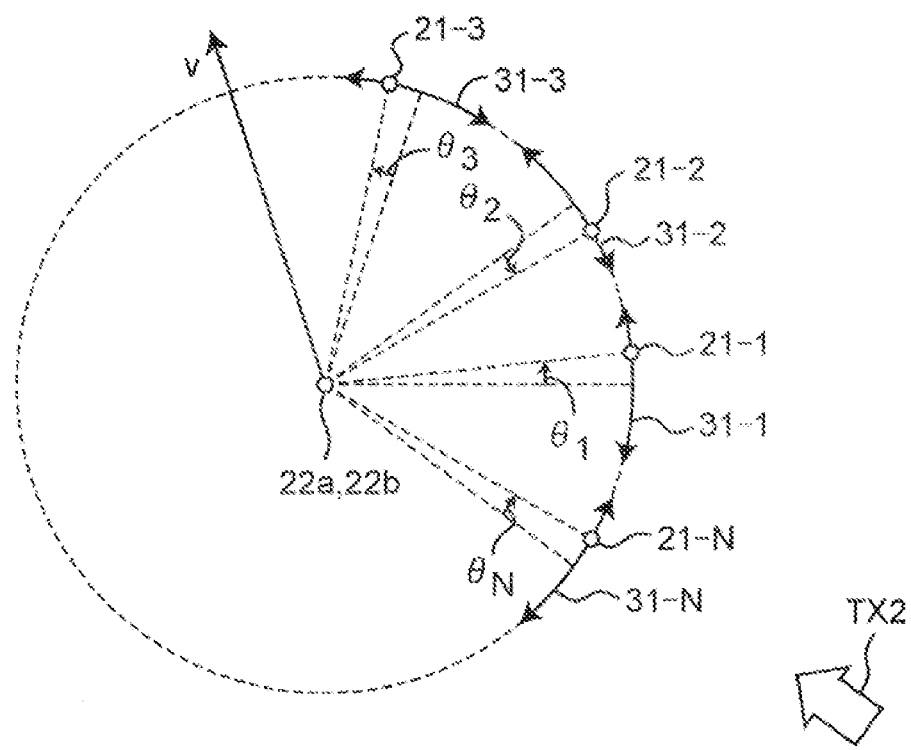
FIG. 7 is a plan view showing an antenna arrangement of the antenna evaluation apparatus of FIG. 5 and a multipath propagation environment with second scatterer antenna positions being set.

FIG. 7 is a plan view showing an antenna arrangement of the antenna evaluation apparatus of FIG. 5 and a multipath propagation environment with second scatterer antenna positions being set. In the arrangement of FIG. 7, the scatterer antennas 21-1 to 21-N are mechanically moved by the amounts of angular change $\theta_1, \theta_2, \theta_3, \ldots, \theta_N$, by their corresponding antenna drive apparatuses 31-1 to 31-N. The computer 10 generates the amounts of angular change $\theta_1, \theta_2, \theta_3, \ldots, \theta_N$ as different random numbers. Radio-frequency signals radiated from the scatterer antennas 21-1 to 21-N as shown in FIG. 7 arrive at each of the receiving antennas 22a and 22b as a set of multipath waves different from that of FIG. 6. The set of multipath waves can be regarded as a second substream TX2 that is different from the first substream TX1 and that is transmitted from, for example, a second transmitting antenna of the MIMO transmitter with two transmitting antennas (see FIG. 15), travels certain propagation paths different from that of the first substream TX1, and arrives thereto.

As can be seen from Equation 2, the received signal waveform of a set of multipath waves arriving at each of the receiving antennas 22a and 22b changes depending on the angles $\phi_i$ at which the scatterer antennas 21-$i$ are positioned. In the present embodiment, in order to create different multipath propagation environments, the scatterer antennas 21-$i$ are mechanically moved as described above, and further, the phases of radio frequency signals are adjusted by phase shifters 13-$i$ based on the angles after moving the scatterer antennas 21-$i$ (i.e., the angle $\phi_i$ in Equation 2 is changed). In the present embodiment, fixed values are used as the initial phases $\alpha_i$ in Equation 2. The computer 10 randomly and independently generates two different sets of amounts of angular change $\theta_{1i}$ and $\theta_{2i}$ ($1 \leq i \leq N$). In this specification, these sets of amounts of angular change are referred to as "angular vectors $A_3 = (\theta_{11}, \ldots, \theta_{1N})$ and $A_4 = (\theta_{21}, \ldots, \theta_{2N})$" hereinafter. These different angular vectors $A_3$ and $A_4$ correspond to different multipath propagation environments (i.e., different propagation paths), and eventually, create different sets of multipath waves around the receiving antennas 22a and 22b. By substituting the angles $(\phi_i - \theta_{1i})$ and $(\phi_i - \theta_{2i})$ for the angle $\phi_i$ in Equation 2, the following two received signal waveforms $S_3(t)$ and $S_4(t)$ are obtained.

$$S_3(t) = \sum_{i=1}^{N} \frac{\lambda}{4\pi \cdot r} \exp[-j\{\beta r + 2\pi \cdot t \cdot f_D \cos(\phi_0 - \phi_i + \theta_{1i}) + \alpha_i\}] \quad \text{[Equation 8]}$$

-continued $$S_4(t) = \sum_{i=1}^{N} \frac{\lambda}{4\pi \cdot r} \exp[-j\{\beta r + 2\pi \cdot t \cdot f_D \cos(\phi_0 - \phi_i + \theta_{2i}) + \alpha_i\}] \quad \text{[Equation 9]}$$

As described above, different multipath propagation environments can be created by changing the angles set in the antenna drive apparatus 31 and in a phase-shift circuit 13.

In order for the antenna evaluation apparatus to evaluate the performance of an antenna apparatus, it is necessary to create a variety of multipath propagation environments. Also in the present embodiment, under an assumption that different substreams TX1 and TX2 transmitted from the MIMO transmitter travel independent propagation paths, different multipath propagation environments are created for the different substreams TX1 and TX2, in a manner similar to that of the first embodiment. Thus, it is desirable to create these multipath propagation environments so as to change the correlation between the multipath propagation environment for the substream TX1 and the multipath propagation environment for the substream TX2 to obtain a variety of correlation values. In the present embodiment, in order to achieve the creation of such multipath propagation environments, an angular vector C between two different angular vectors $A_3$ and $A_4$ is defined using a parameter k ($0 \leq k \leq 1$), as follows.

$$C = k \cdot A_3 + (1-k) \cdot A_4 \quad \text{[Equation 10]}$$

By changing the parameter k in Equation 10, angular vectors C having various different values are obtained. By radiating radio frequency signals with these angular vectors C being set using the antenna drive apparatuses 31-1 to 31-N and the phase shifters 13-1 to 13-N, various and different multipath propagation environments are created in a manner similar to that of the first embodiment. Accordingly, a set of multipath waves arriving at the receiving antennas 22*a* and 22*b* with an angular vector defined by Equation 10 being set can be regarded as a first substream TX1 transmitted from the MIMO transmitter, and a set of multipath waves arriving at the receiving antennas 22*a* and 22*b* with another angular vector defined by Equation 10 being set can be regarded as a second substream TX2 transmitted from the MIMO transmitter. When any one of the angular vectors (e.g., the angular vector $A_3$ or $A_4$, or any angular vector C defined by Equation 10) is used as a reference angular vector, the other angular vectors have certain distances from the reference angular vector. According to these distances, the correlation between corresponding multipath propagation environments changes.

In order to simplify the operation, one angular vector $A_3$ may be set to "0" (see FIG. 6), and only the other angular vector $A_4$ may be changed.

By generating amounts of angular change for the respective angular vectors $A_3$ and $A_4$, as random numbers which are different for the different scatterer antennas 21-1 to 21-N, it is possible to arrange the scatterer antennas 21-1 to 21-N with these angular vectors being set, at a constant average angle.

As described above, the antenna evaluation apparatus of the present embodiment is characterized by: generating angular vectors $A_3$ and $A_4$, each including amounts of angular change for angles of directions from the receiving antennas 22*a* and 22*b* to the positions of the respective scatterer antennas 21-1 to 21-N, determining an angular vector C between a pair of corresponding amounts of angular change in the angular vector $A_3$ and in the angular vector $A_4$, and making a plurality of radio frequency signals radiate with the angular vector C being set in the antenna drive apparatus 31 and in the phase-shift circuit 13. The antenna evaluation apparatus of the present embodiment may further repeat determining an angular vector C and making a plurality of radio frequency signals radiate with the angular vector C being set in the antenna drive apparatus 31 and in the phase-shift circuit 13. Accordingly, the antenna evaluation apparatus of the present embodiment can efficiently create a variety of multipath propagation environments when evaluating the performance of receiving antennas of a MIMO wireless communication system.

Third Embodiment.

In the second embodiment, the positions of scatterer antennas 21-1 to 21-N are changed in order to create different multipath propagation environments. Alternatively, a third embodiment is characterized by changing the orientations of receiving antennas 22*a* and 22*b*.

Figure 8:
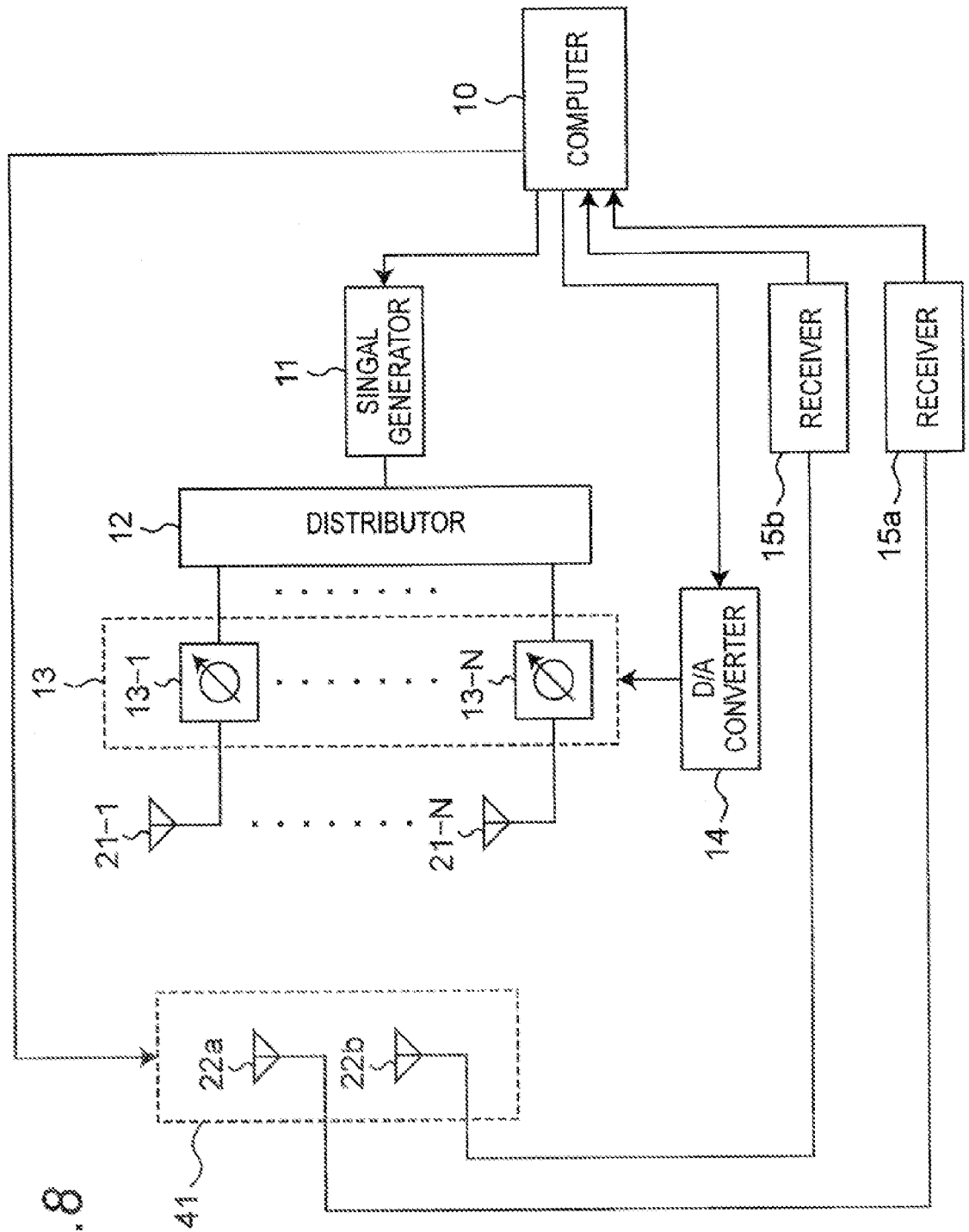
FIG. 8 is a block diagram showing a configuration of an antenna evaluation apparatus according to a third embodiment of the present invention.
Figure 9:
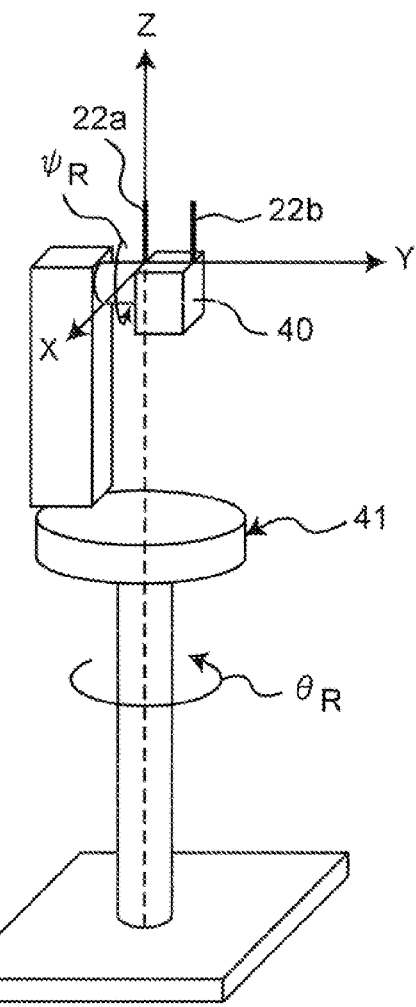
FIG. 9 is a perspective view showing a receiving antenna support 41 of FIG. 8.

FIG. 8 is a block diagram showing a configuration of an antenna evaluation apparatus according to the third embodiment of the present invention. The antenna evaluation apparatus of the present embodiment has the same configuration as that of the antenna evaluation apparatus of FIG. 1, and further includes a receiving antenna support 41 for changing the orientations (angular directions) of the receiving antennas 22*a* and 22*b*. FIG. 9 is a perspective view showing the receiving antenna support 41 of FIG. 8. As shown in FIG. 9, a MIMO receiver 40 including the receiving antennas 22*a* and 22*b* is mounted on the receiving antenna support 41, and is mechanically rotated in an azimuth direction (indicated by an angle $\theta_R$). More preferably, the MIMO receiver including the receiving antennas 22*a* and 22*b* may be mechanically rotated in an elevation direction (indicated by an angle $\psi_R$). A computer 10 controls the receiving antenna support 41 to mechanically rotate the receiving antennas 22*a* and 22*b* to a desired angle.

As described above in connection with the second embodiment, the received signal waveform of a set of multipath waves arriving at each of the receiving antennas 22*a* and 22*b* changes depending on the angles $\phi_i$ at which the scatterer antennas 21-*i* are positioned. The angles are also changed by changing the angles of the receiving antennas 22*a* and 22*b*, instead of changing the positions of the scatterer antennas 21-*i* themselves. In the present embodiment, in order to create different multipath propagation environments, the receiving antennas 22*a* and 22*b* are mechanically rotated, and further, the phases of radio frequency signals are adjusted by corresponding phase shifters 13-*i* based on the angles after rotating the receiving antennas 22*a* and 22*b* (i.e., the angle $\phi_i$ in Equation 2 is changed). The computer 10 randomly and independently generates two different amounts of angular change $\theta_{R1}$ and $\theta_{R2}$, which are the amounts of angular change in the azimuth direction of the receiving antennas 22*a* and 22*b*. These different amounts of angular change $\theta_{R1}$ and $\theta_{R2}$ correspond to different multipath propagation environments (i.e., different propagation paths), and eventually, create different sets of multipath waves around the receiving antennas 22*a* and 22*b*. By substituting the angles ($\phi_i - \theta_{R1}$) and ($\phi_i - \theta_{R2}$) for the angle $\phi_i$ in Equation 2, the following two received signal waveforms $S_5(t)$ and $S_6(t)$ are obtained.

$$S_5(t) = \sum_{i=1}^{N} \frac{\lambda}{4\pi \cdot r} \exp[-j\{\beta r + 2\pi \cdot t \cdot f_D \cos(\phi_0 - \phi_i + \theta_{R1}) + \alpha_i\}] \quad \text{[Equation 11]}$$

-continued $$S_6(t) = \sum_{i=1}^{N} \frac{\lambda}{4\pi \cdot r} \exp[-j\{\beta r + 2\pi \cdot t \cdot f_D \cos(\phi_0 - \phi_i + \theta_{R2}) + \alpha_i\}]$$ [Equation 12]

Figure 10:
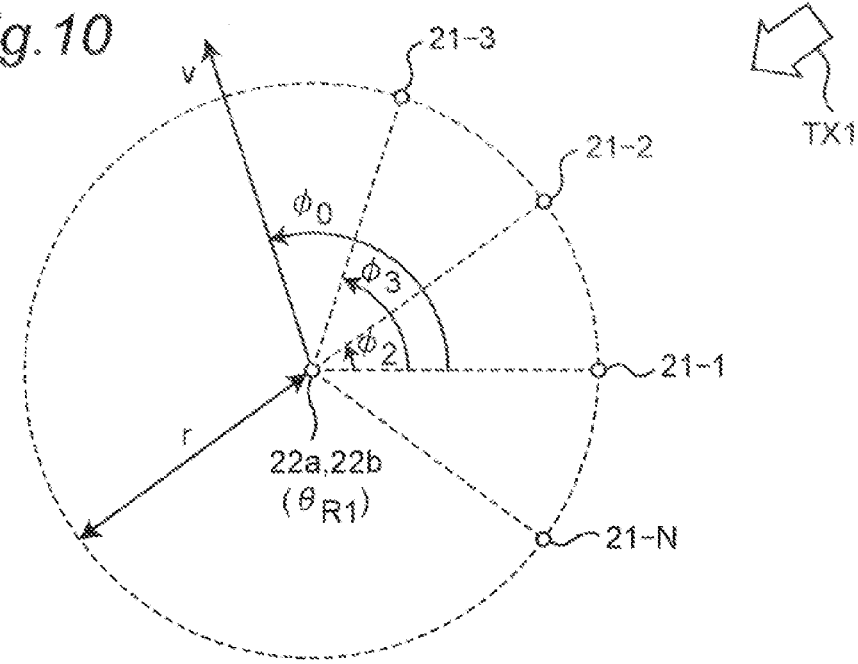
FIG. 10 is a plan view showing an antenna arrangement of the antenna evaluation apparatus of FIG. 8 and a multipath propagation environment with a first receiving antenna angle $\theta_{R1}$ being set.

FIG. 10 is a plan view showing an antenna arrangement of the antenna evaluation apparatus of FIG. 8 and a multipath propagation environment with the first amount of angular change $\theta_{R1}$ being set. In the arrangement shown in FIG. 10, the receiving antennas 22a and 22b are mechanically rotated by the receiving antenna support 41 by the amount of angular change $\theta_{R1}$ from a given reference angle. Radio-frequency signals radiated from the scatterer antennas 21-1 to 21-N to the receiving antennas 22a and 22b as shown in FIG. 10 arrive at each of the receiving antennas 22a and 22b as a set of multipath waves. The set of multipath waves can be regarded as a first substream TX1 that is transmitted from, for example, a first transmitting antenna of a MIMO transmitter with two transmitting antennas (see FIG. 15), travels certain propagation paths, and arrives thereto.

Figure 11:
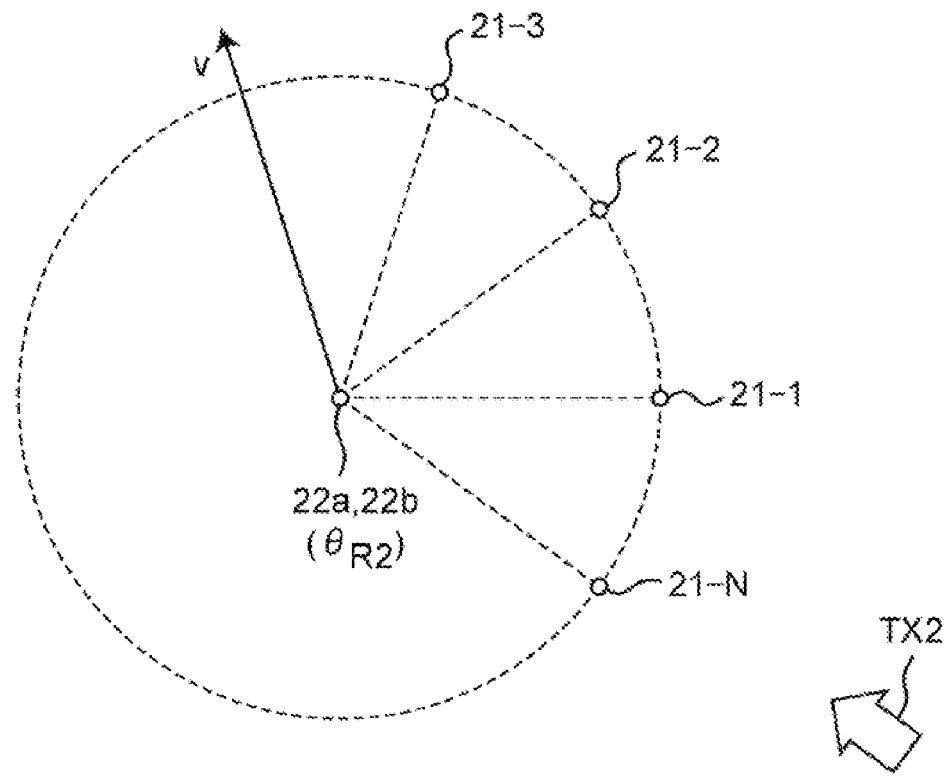
FIG. 11 is a plan view showing an antenna arrangement of the antenna evaluation apparatus of FIG. 8 and a multipath propagation environment with a second receiving antenna angle $\theta_{R2}$ being set.

FIG. 11 is a plan view showing an antenna arrangement of the antenna evaluation apparatus of FIG. 8 and a multipath propagation environment with the second amount of angular change $\theta_{R2}$ being set. In the arrangement shown in FIG. 11, the receiving antennas 22a and 22b are mechanically rotated by the receiving antenna support 41 by the amount of angular change $\theta_{R2}$ from the given reference angle. Radio-frequency signals radiated from the scatterer antennas 21-1 to 21-N to the receiving antennas 22a and 22b as shown in FIG. 11 arrive at each of the receiving antennas 22a and 22b as a set of multipath waves different from that of FIG. 10. The set of multipath waves can be regarded as a second substream TX2 that is different from the first substream TX1 and that is transmitted from, for example, a second transmitting antenna of the MIMO transmitter with two transmitting antennas (see FIG. 15), travels certain propagation paths different from that of the first substream TX1, and arrives thereto.

As described above, different multipath propagation environments can be created by changing the angles set in the receiving antenna support 41 and in a phase-shift circuit 13.

In order for the antenna evaluation apparatus to evaluate the performance of an antenna apparatus, it is necessary to create a variety of multipath propagation environments. Also in the present embodiment, under an assumption that different substreams TX1 and TX2 transmitted from the MIMO transmitter travel independent propagation paths, different multipath propagation environments are created for the different substreams TX1 and TX2, in a manner similar to that of the first embodiment. Thus, it is desirable to create these multipath propagation environments so as to change the correlation between the multipath propagation environment for the substream TX1 and the multipath propagation environment for the substream TX2 to obtain a variety of correlation values. In the present embodiment, in order to achieve the creation of such multipath propagation environments, an amount of angular change D between two different amounts of angular change $\theta_{R1}$ and $\theta_{R2}$ is defined using a parameter k ($0 \leq k \leq 1$), as follows.

$$D = k \cdot \theta_{R1} + (1-k) \cdot \theta_{R2}$$ [Equation 13]

By changing the parameter k in Equation 13, amounts of angular change D having various different values are obtained. By radiating radio frequency signals with these amounts of angular change D being set using the receiving antenna support 41 and phase shifters 13-1 to 13-N, various and different multipath propagation environments are created in a manner similar to those in the first and second embodiments. Accordingly, a set of multipath waves arriving at the receiving antennas 22a and 22b with an amount of angular change defined by Equation 13 being set can be regarded as a first substream TX1 transmitted from the MIMO transmitter, and a set of multipath waves arriving at the receiving antennas 22a and 22b with another amount of angular change defined by Equation 13 being set can be regarded as a second substream TX2 transmitted from the MIMO transmitter. When any one of the receiving antenna angles (e.g., an angle changed by the amount of angular change $\theta_{R1}$ or $\theta_{R2}$, or an angle changed by any amount of angular change D defined by Equation 13) is used as a reference receiving antenna angle, the other receiving antenna angles have certain distances from the reference receiving antenna angle. According to these distances, the correlation between corresponding multipath propagation environments changes.

In order to simplify the operation, one amount of angular change $\theta_{R1}$ may be set to "0", and only the other amount of angular change $\theta_{R2}$ may be changed.

The present embodiment can be considered as one case of the second embodiment in which all the amounts of angular change of the angular vector $A_3$ have the same value $\theta_{R1}$, all the amounts of angular change of the angular vector $A_4$ have the same value $\theta_{R2}$, and thus, all the amounts of angular change of the angular vector C have the same value D.

As described above, the antenna evaluation apparatus of the present embodiment is characterized by: generating amounts of angular change $\theta_{R1}$ and $\theta_{R1}$; determining an amount of angular change D between the amounts of angular change $\theta_{R1}$ and $\theta_{R1}$; and making a plurality of radio frequency signals radiate with the amount of angular change D being set in the receiving antenna support 41 and in the phase-shift circuit 13. The antenna evaluation apparatus of the present embodiment may further repeat determining an amount of angular change D and making a plurality of radio frequency signals radiate with the amount of angular change D being set in the receiving antenna support 41 and in the phase-shift circuit 13. Accordingly, the antenna evaluation apparatus of the present embodiment can efficiently create a variety of multipath propagation environments when evaluating the performance of receiving antennas of a MIMO wireless communication system.

Fourth Embodiment.

In the second embodiment, in order to create different multipath propagation environments, scatterer antennas 21-1 to 21-N are mechanically moved, and further, the phases of radio frequency signals are adjusted by a phase-shift circuit 13 based on the angles after moving the scatterer antennas 21-1 to 21-N. Alternatively, a fourth embodiment is characterized by controlling only the phase-shift circuit 13 to virtually change the positions of the scatterer antennas 21-1 to 21-N.

An antenna evaluation apparatus of the present embodiment has the same configuration as that of the first embodiment. In order to achieve received signal waveforms of Equation 8 and 9, the phases of radio frequency signals are adjusted by corresponding phase shifters 13-i based on amounts of angular change $\theta_{1i}$ and $\theta_{2i}$ without actually moving the positions of the scatterer antennas 21-i (i.e., only the rates for the phase shifters 13-i to change the amounts of phase adjustment is controlled). Thus, in the present embodiment, the positions of the scatterer antennas 21-i can be "virtually" moved.

Figure 12:
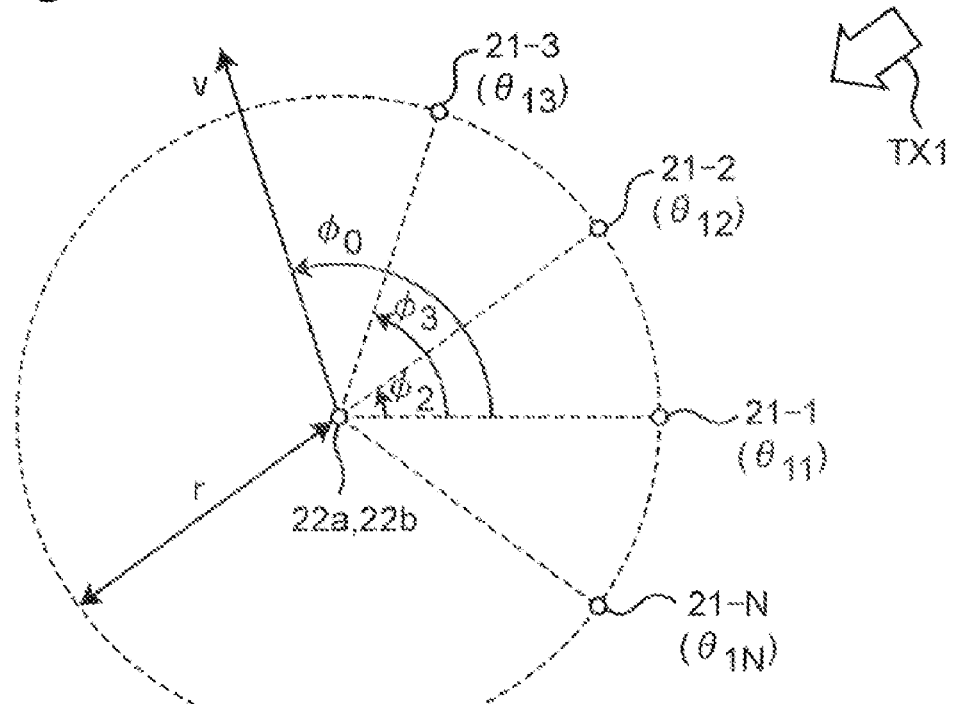
FIG. 12 is a plan view showing an antenna arrangement of an antenna evaluation apparatus according to a fourth embodiment of the present invention and a multipath propagation environment with first scatterer antenna positions being virtually set.

FIG. 12 is a plan view showing an antenna arrangement of the antenna evaluation apparatus according to the fourth embodiment of the present invention and a multipath propagation environment with first scatterer antenna positions being virtually set. For the first scatterer antenna positions, a setting corresponding to an angular vector $A_3$ in the second embodiment is used. In the arrangement shown in FIG. 12, the phases of radio frequency signals to be radiated from the scatterer antennas 21-$i$, respectively, are adjusted by corresponding phase shifters 13-$i$ based on the amounts of angular change $\theta_{1i}$. Radio-frequency signals radiated from the scatterer antennas 21-1 to 21-N set as shown in FIG. 12 arrive at each of receiving antennas 22$a$ and 22$b$ as a set of multipath waves. The set of multipath waves can be regarded as a first substream TX1 that is transmitted from, for example, a first transmitting antenna of a MIMO transmitter with two transmitting antennas (see FIG. 15), travels certain propagation paths, and arrives thereto.

Figure 13:
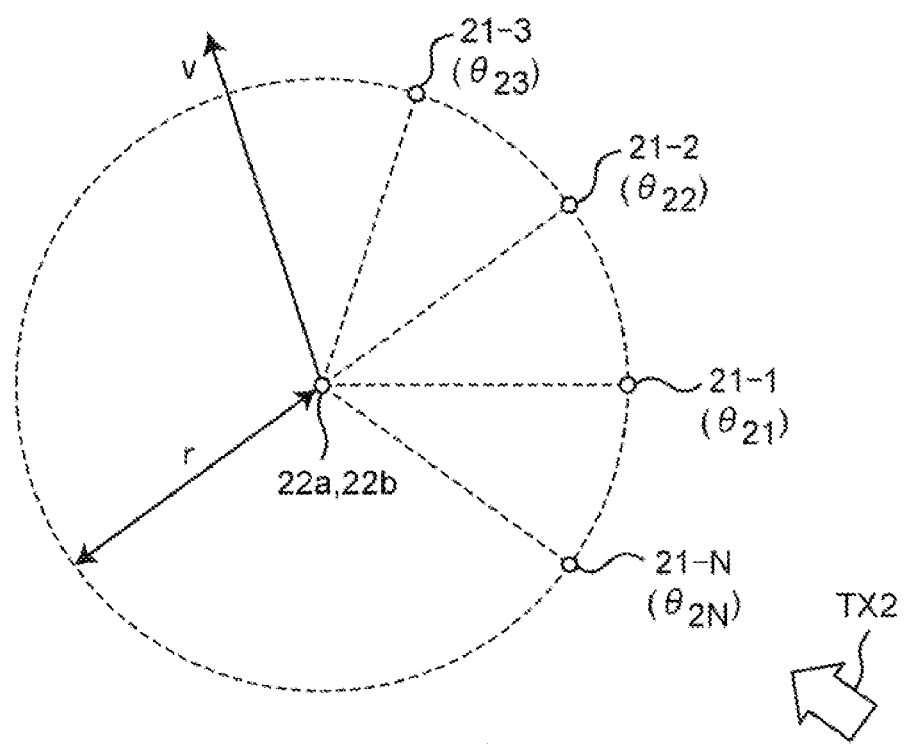
FIG. 13 is a plan view showing an antenna arrangement of the antenna evaluation apparatus according to the fourth embodiment of the present invention and a multipath propagation environment with second scatterer antenna positions being virtually set.

FIG. 13 is a plan view showing an antenna arrangement of the antenna evaluation apparatus according to the fourth embodiment of the present invention and a multipath propagation environment with second scatterer antenna positions being virtually set. For the second scatterer antenna positions, a setting corresponding to an angular vector $A_4$ in the second embodiment is used. In the arrangement shown in FIG. 13, the phases of radio frequency signals to be radiated from the scatterer antennas 21-$i$, respectively, are adjusted by corresponding phase shifters 13-$i$ based on the amounts of angular change $\theta_{2i}$. Radio-frequency signals radiated from the scatterer antennas 21-1 to 21-N set as shown in FIG. 13 arrive at each of the receiving antennas 22$a$ and 22$b$ as a set of multipath waves different from that of FIG. 12. The set of multipath waves can be regarded as a second substream TX2 that is different from the first substream TX1 and that is transmitted from, for example, a second transmitting antenna of the MIMO transmitter with two transmitting antennas (see FIG. 15), travels certain propagation paths different from that of the first substream TX1, and arrives thereto.

As shown in FIGS. 12 and 13, different multipath propagation environments can be created by setting different angular vectors.

In order for the antenna evaluation apparatus to evaluate the performance of an antenna apparatus, it is necessary to create a variety of multipath propagation environments. By changing a parameter k in Equation 10, angular vectors C having various different values are obtained. By radiating radio frequency signals with these angular vectors C being set using the phase-shift circuit 13, various and different multipath propagation environments are created in a manner similar to that of the second embodiment. Accordingly, a set of multipath waves arriving at the receiving antennas 22$a$ and 22$b$ with an angular vector defined by Equation 10 being set can be regarded as a first substream TX1 transmitted from the MIMO transmitter, and a set of multipath waves arriving at the receiving antennas 22$a$ and 22$b$ with another angular vector defined by Equation 10 being set can be regarded as a second substream TX2 transmitted from the MIMO transmitter. When any one of the angular vectors (e.g., the angular vector $A_3$ or $A_4$, or any angular vector C defined by Equation 10) is used as a reference angular vector, the other angular vectors have certain distances from the reference angular vector. According to these distances, the correlation between corresponding multipath propagation environments changes.

In order to simplify the operation, the phase-shift circuit 13 may be controlled such that one angular vector $A_3$ is set to "0" (see FIG. 6) and only the other angular vector $A_4$ is changed.

As described above, the antenna evaluation apparatus of the present embodiment is characterized by: generating angular vectors $A_3$ and $A_4$, each including amounts of angular change for angles of directions from the receiving antennas 22$a$ and 22$b$ to the positions of the respective scatterer antennas 21-1 to 21-N; determining an angular vector C including amounts of angular change, each between a pair of corresponding amounts of angular change in the angular vector $A_3$ and in the angular vector $A_4$; adjusting the phases of a plurality of radio frequency signals using the phase-shift circuit 13 based on corresponding amounts of angular change of the angular vector C; and making the plurality of radio frequency signals radiate. The antenna evaluation apparatus of the present embodiment may further repeat determining an angular vector C, adjusting the phases of a plurality of radio frequency signals using the phase-shift circuit 13 based on corresponding amounts of angular change of the angular vector C, and making the plurality of radio frequency signals radiate. Accordingly, the antenna evaluation apparatus of the present embodiment can efficiently create a variety of multipath propagation environments when evaluating the performance of receiving antennas of a MIMO wireless communication system. Furthermore, the configuration of the antenna evaluation apparatus can be simplified, as compared with the case of mechanically moving the scatterer antennas 21-1 to 21-N as in the second embodiment (or the case of mechanically rotating the receiving antennas 22$a$ and 22$b$ as in the third embodiment).

In the above description, incoming waves at the receiving antennas 22$a$ and 22$b$ are assumed to be uniformly distributed over all azimuth angles, however, the configuration is not limited thereto. Antenna evaluation apparatuses according to the embodiments of the present invention may be configured to further include an attenuator between each phase shifter and a corresponding scatterer antenna and produce fading other than Rayleigh fading.

Figure 15:
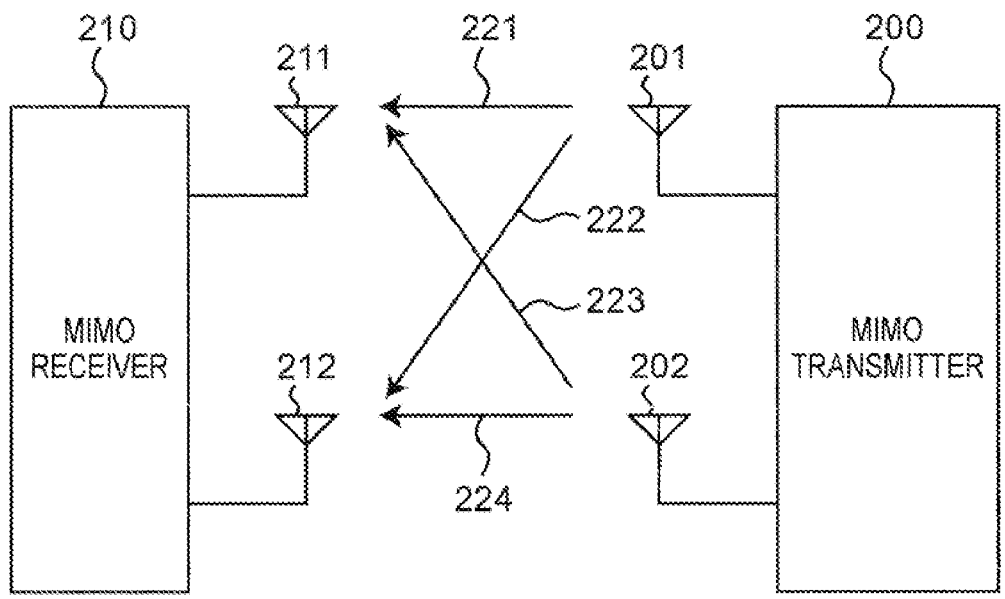
FIG. 15 is a schematic diagram showing a MIMO wireless communication system.

The above description is based on a MIMO wireless communication system including a MIMO transmitter with two transmitting antennas and a MIMO receiver with two receiving antennas, such as that shown in FIG. 15. However, antenna evaluation apparatuses according to the embodiments of the present invention can evaluate the performance of receiving antennas of a MIMO wireless communication system including more transmitting antennas and/or more receiving antennas. In this case, changing the parameter k in Equation 6, etc. results in various different settings (i.e., initial phase vectors of the first embodiment, angular vectors of the second and fourth embodiments, and amounts of angular change of the third embodiment). By radiating radio frequency signals using these settings, various and different multipath propagation environments are created. Sets of multipath waves arriving at the receiving antenna 22$a$ and 22$b$ under these multipath propagation environments can be regarded as a plurality of substreams transmitted from a MIMO transmitter with three or more transmitting antennas.

Industrial Applicability

The antenna evaluation apparatuses of the present invention can efficiently create a variety of multipath propagation environments when evaluating the performance of a receiving antenna of a MIMO wireless communication system.

Reference Signs List

10: COMPUTER,
11: SIGNAL GENERATOR,
12: DIVIDER,
13: PHASE-SHIFT CIRCUIT,
13-1 to 13-N: PHASE SHIFTER,
14: D/A CONVERTER,
15$a$ and 15$b$: RECEIVER,
21-1 to 21-N: SCATTERER ANTENNA,
22$a$ and 22$b$: RECEIVING ANTENNA,
31 and 31-1 to 31-N: ANTENNA DRIVE APPARATUS, 40: MIMO RECEIVER, and
41: RECEIVING ANTENNA SUPPORT.

The invention claimed is:

1. An antenna evaluation apparatus including at least one receiving antenna to be evaluated and a plurality of scatterer antennas surrounding the receiving antenna, the antenna evaluation apparatus comprising:
   a signal generator for generating a radio frequency signal;
   a divider for dividing the generated radio frequency signal;
   a phase-shift circuit for adjusting phases of respective distributed radio frequency signals; and
   a controller for controlling the phase-shift circuit, so as to create a set of multipath waves around the receiving antenna when the adjusted radio frequency signals is respectively radiated from the scatterer antennas,
   wherein the controller:
   generates a first set of initial phases and a second set of initial phases, such that a set of multipath waves to be created around the receiving antenna by the radiated radio frequency signals, whose phases are adjusted by the phase-shift circuit to have corresponding initial phases in the first set of initial phases, is different from another set of multipath waves to be created around the receiving antenna by the radiated radio frequency signals, whose phases are adjusted by the phase-shift circuit to have corresponding initial phases in the second set of initial phases;
   determines a third set of initial phases including arbitrary initial phases, each arbitrary initial phase between a pair of corresponding initial phases in the first set of initial phases and in the second set of initial phases; and
   adjusts the phases of the radio frequency signals using the phase-shift circuit such that the phases of the radio frequency signals have corresponding initial phases in the third set of initial phases, and makes the adjusted radio frequency signals radiate.

2. The antenna evaluation apparatus as claimed in claim 1, wherein the controller repeats: determining a third set of initial phases, adjusting the phases of the radio frequency signals using the phase-shift circuit such that the phases of the radio frequency signals have corresponding initial phases in the third set of initial phases, and making the adjusted radio frequency signals radiate.

3. The antenna evaluation apparatus as claimed in claim 1, wherein the controller adjusts the phases of the radio frequency signals using the phase-shift circuit such that the phases of the radio frequency signals have corresponding initial phases in one set of the first and second set of initial phases, and makes the adjusted radio frequency signals radiate.

4. The antenna evaluation apparatus as claimed in claim 1, wherein each initial phase in the first and second sets of initial phases is generated as a random number.

5. The antenna evaluation apparatus as claimed in claim 1, wherein the signal generator generates a radio frequency signal of a non-modulated continuous wave.

6. An antenna evaluation apparatus including at least one receiving antenna to be evaluated and a plurality of scatterer antennas surrounding the receiving antenna, the antenna evaluation apparatus comprising:
   a signal generator for generating a radio frequency signal;
   a divider for dividing the generated radio frequency signal;
   a phase-shift circuit for adjusting phases of respective distributed radio frequency signals; and
   a controller for controlling the phase-shift circuit, so as to create a set of multipath waves around the receiving antenna when the adjusted radio frequency signals is respectively radiated from the scatterer antennas,
   wherein the controller:
   changes an amount of phase shift of the phase-shift circuit for adjusting the phases of the radio frequency signals to be radiated from the respective scatterer antennas, based on corresponding angles of directions from the receiving antenna to positions of the respective scatterer antennas;
   generates a first set of amounts of angular change and a second set of amounts of angular change, each set including amounts of angular change for the respective angles of the directions from the receiving antenna to the positions of the respective scatterer antennas, such that a set of multipath waves to be created around the receiving antenna by the radiated radio frequency signals, whose phases are adjusted by the phase-shift circuit based on corresponding amounts of angular change in the first set of amounts of angular change, is different from a set of multipath waves to be created around the receiving antenna by the radiated radio frequency signals, whose phases are adjusted by the phase-shift circuit based on corresponding amounts of angular change in the second set of amounts of angular change;
   determines a third set of amounts of angular change including arbitrary amounts of angular change, each arbitrary amount of angular change between a pair of corresponding amounts of angular change in the first set of amounts of angular change and in the second set of amounts of angular change; and
   adjusts the phases of the radio frequency signals based on corresponding amounts of angular change in the third set of amounts of angular change using the phase-shift circuit, and makes the adjusted radio frequency signals radiate.

7. The antenna evaluation apparatus as claimed in claim 6, wherein the controller repeats: determining a third set of amounts of angular change, adjusting the phases of the radio frequency signals based on corresponding amounts of angular change in the third set of amounts of angular change using the phase-shift circuit, and making the adjusted radio frequency signals radiate.

8. The antenna evaluation apparatus as claimed in claim 6, wherein the controller adjusts the phases of the radio frequency signals based on corresponding amounts of angular change in one set of the first and second set of amounts of angular change using the phase-shift circuit, and makes the adjusted radio frequency signals radiate.

9. The antenna evaluation apparatus as claimed in claim 6, further comprising a first antenna drive apparatus for moving the scatterer antennas to change the angles of the directions from the receiving antenna to the positions of the respective scatterer antennas,
   wherein when the controller adjusts the phases of the radio frequency signals based on corresponding amounts of angular change in the third set of amounts of angular change using the phase-shift circuit, and makes the adjusted radio frequency signals radiate, the controller further moves the scatterer antennas according to the amounts of angular change in the third set of amounts of angular change using the first antenna drive apparatus.

10. The antenna evaluation apparatus as claimed in claim 9, wherein the controller adjusts the phases of the radio frequency signals based on corresponding amounts of angular change in one set of the first and second set of amounts of angular change using the phase-shift circuit, and makes the adjusted radio frequency signals radiate; and wherein when the controller adjusts the phases of the radio frequency signals based on corresponding amounts of angular change in one set of the first and second set of amounts of angular change using the phase-shift circuit, and makes the adjusted radio frequency signals radiate, the controller further moves the scatterer antennas according to the amounts of angular change in one set of the first and second set of amounts of angular change using the first antenna drive apparatus.

11. The antenna evaluation apparatus as claimed in claim 6, wherein each amount of angular change in the first and second sets of amounts of angular change is generated as a random number.

12. The antenna evaluation apparatus as claimed in claim 6, further comprising a second antenna drive apparatus for rotating the receiving antenna to change the angles of the directions from the receiving antenna to the positions of the respective scatterer antennas,
wherein all the amounts of angular change in the first set of amounts of angular change have the same value, all the amounts of angular change in the second set of amounts of angular change have the same value, and thus, all the amounts of angular change in the third set of amounts of angular change have the same value, and
wherein when the controller adjusts the phases of the radio frequency signals based on corresponding amounts of angular change in the third set of amounts of angular change using the phase-shift circuit, and makes the adjusted radio frequency signals radiate, the controller further rotates the receiving antenna according to the amounts of angular change in the third set of amounts of angular change using the second antenna drive apparatus.

13. The antenna evaluation apparatus as claimed in claim 12,
wherein the controller adjusts the phases of the radio frequency signals based on corresponding amounts of angular change in one set of the first and second set of amounts of angular change using the phase-shift circuit, and makes the adjusted radio frequency signals radiate; and
wherein when the controller adjusts the phases of the radio frequency signals based on corresponding amounts of angular change in one set of the first and second set of amounts of angular change using the phase-shift circuit, and makes the adjusted radio frequency signals radiate, the controller further rotates the receiving antenna according to the amounts of angular change in one set of the first and second set of amounts of angular change using the second antenna drive apparatus.

14. An antenna evaluation method for evaluating at least one receiving antenna to be evaluated, using an antenna evaluation apparatus including the receiving antenna and a plurality of scatterer antennas surrounding the receiving antenna, the antenna evaluation apparatus comprising:
a signal generator for generating a radio frequency signal;
a divider for dividing the generated radio frequency signal;
a phase-shift circuit for adjusting phases of respective distributed radio frequency signals; and
a controller for controlling the phase-shift circuit, so as to create a set of multipath waves around the receiving antenna when the adjusted radio frequency signals is respectively radiated from the scatterer antennas,
wherein the antenna evaluation method including the steps of:
generating a first set of initial phases and a second set of initial phases, such that a set of multipath waves to be created around the receiving antenna by the radiated radio frequency signals, whose phases are adjusted by the phase-shift circuit to have corresponding initial phases in the first set of initial phases, is different from a set of multipath waves to be created around the receiving antenna by the radiated radio frequency signals, whose phases are adjusted by the phase-shift circuit to have corresponding initial phases in the second set of initial phases;
determining a third set of initial phases including arbitrary initial phases, each arbitrary initial phase between a pair of corresponding initial phases in the first set of initial phases and in the second set of initial phases; and
adjusting the phases of the radio frequency signals using the phase-shift circuit such that the phases of the radio frequency signals have corresponding initial phases in the third set of initial phases, and making the adjusted radio frequency signals radiate.

15. The antenna evaluation method as claimed in claim 14, further including the step of repeating: determining a third set of initial phases, adjusting the phases of the radio frequency signals using the phase-shift circuit such that the phases of the radio frequency signals have corresponding initial phases in the third set of initial phases, and making the adjusted radio frequency signals radiate.

16. The antenna evaluation method as claimed in claim 14, further including the steps of adjusting the phases of the radio frequency signals using the phase-shift circuit such that the phases of the radio frequency signals have corresponding initial phases in one set of the first and second set of initial phases, and making the adjusted radio frequency signals radiate.

17. The antenna evaluation method as claimed in claim 14, wherein each initial phase in the first and second sets of initial phases is generated as a random number.

18. The antenna evaluation method as claimed in claim 14, wherein the signal generator generates a radio frequency signal of a non-modulated continuous wave.

19. An antenna evaluation method for evaluating at least one receiving antenna to be evaluated, using an antenna evaluation apparatus including the receiving antenna and a plurality of scatterer antennas surrounding the receiving antenna, the antenna evaluation apparatus comprising:
a signal generator for generating a radio frequency signal;
a divider for dividing the generated radio frequency signal;
a phase-shift circuit for adjusting phases of respective distributed radio frequency signals; and
a controller for controlling the phase-shift circuit, so as to create a set of multipath waves around the receiving antenna when the adjusted radio frequency signals is respectively radiated from the scatterer antennas,
wherein the antenna evaluation method including the steps of:
changing an amount of phase shift of the phase-shift circuit for adjusting the phases of the radio frequency signals to be radiated from the respective scatterer antennas, based on corresponding angles of directions from the receiving antenna to positions of the respective scatterer antennas;
generating a first set of amounts of angular change and a second set of amounts of angular change, each set including amounts of angular change for the respective angles of the directions from the receiving antenna to the positions of the respective scatterer antennas, such that a set of multipath waves to be created around the receiving antenna by the radiated radio frequency signals, whose phases are adjusted by the phase-shift circuit based on corresponding amounts of angular change in the first set of amounts of angular change, is different from a set of multipath waves to be created around the receiving antenna by the radiated radio frequency signals, whose phases are adjusted by the phase-shift circuit based on corresponding amounts of angular change in the second set of amounts of angular change;

determining a third set of amounts of angular change including arbitrary amounts of angular change, each arbitrary amount of angular change between a pair of corresponding amounts of angular change in the first set of amounts of angular change and in the second set of amounts of angular change; and adjusting the phases of the radio frequency signals based on corresponding amounts of angular change in the third set of amounts of angular change using the phase-shift circuit, and making the adjusted radio frequency signals radiate.

20. The antenna evaluation method as claimed in claim 19, further including the step of repeating: determining a third set of amounts of angular change, adjusting the phases of the radio frequency signals based on corresponding amounts of angular change in the third set of amounts of angular change using the phase-shift circuit, and making the adjusted radio frequency signals radiate.

21. The antenna evaluation method as claimed in claim 19, further including the steps of adjusting the phases of the radio frequency signals based on corresponding amounts of angular change in one set of the first and second set of amounts of angular change using the phase-shift circuit, and making the adjusted radio frequency signals radiate.

22. The antenna evaluation method as claimed in claim 19, wherein the antenna evaluation apparatus further comprises a first antenna drive apparatus for moving the scatterer antennas to change the angles of the directions from the receiving antenna to the positions of the respective scatterer antennas, and wherein the antenna evaluation method further includes the step of further moving the scatterer antennas according to the amounts of angular change in the third set of amounts of angular change using the first antenna drive apparatus, when adjusting the phases of the radio frequency signals based on corresponding amounts of angular change in the third set of amounts of angular change using the phase-shift circuit, and making the adjusted radio frequency signals radiate.

23. The antenna evaluation method as claimed in claim 22, further including the steps of:

adjusting the phases of the radio frequency signals based on corresponding amounts of angular change in one set of the first and second set of amounts of angular change using the phase-shift circuit, and makes the adjusted radio frequency signals radiate; and further moving the scatterer antennas according to the amounts of angular change in one set of the first and second set of amounts of angular change using the first antenna drive apparatus, when adjusting the phases of the radio frequency signals based on corresponding amounts of angular change in one set of the first and second set of amounts of angular change using the phase-shift circuit, and making the adjusted radio frequency signals radiate.

24. The antenna evaluation method as claimed in claim 19, wherein each amount of angular change in the first and second sets of amounts of angular change is generated as a random number.

25. The antenna evaluation method as claimed in claim 19, wherein the antenna evaluation apparatus further comprises a second antenna drive apparatus for rotating the receiving antenna to change the angles of the directions from the receiving antenna to the positions of the respective scatterer antennas, wherein all the amounts of angular change in the first set of amounts of angular change have the same value, all the amounts of angular change in the second set of amounts of angular change have the same value, and thus, all the amounts of angular change in the third set of amounts of angular change have the same value, and wherein the antenna evaluation method further includes the step of further rotating the receiving antenna according to the amounts of angular change in the third set of amounts of angular change using the second antenna drive apparatus, when adjusting the phases of the radio frequency signals based on corresponding amounts of angular change in the third set of amounts of angular change using the phase-shift circuit, and making the adjusted radio frequency signals radiate.

26. The antenna evaluation method as claimed in claim 25, further including the steps of:

adjusting the phases of the radio frequency signals based on corresponding amounts of angular change in one set of the first and second set of amounts of angular change using the phase-shift circuit, and makes the adjusted radio frequency signals radiate; and further rotating the receiving antenna according to the amounts of angular change in one set of the first and second set of amounts of angular change using the second antenna drive apparatus, when adjusting the phases of the radio frequency signals based on corresponding amounts of angular change in one set of the first and second set of amounts of angular change using the phase-shift circuit, and making the adjusted radio frequency signals radiate.

* * * * *